(12) United States Patent
Aoki et al.

(10) Patent No.: US 11,126,094 B2
(45) Date of Patent: Sep. 21, 2021

(54) EXPOSURE APPARATUS, MANUFACTURING METHOD OF FLAT-PANEL DISPLAY, DEVICE MANUFACTURING METHOD, AND EXPOSURE METHOD

(71) Applicant: NIKON CORPORATION, Tokyo (JP)

(72) Inventors: Yasuo Aoki, Zushi (JP); Atsushi Hara, Yokohama (JP); Takachika Shimoyama, Yokohama (JP); Toru Kawaguchi, Kawasaki (JP); Katsuhiro Shimatake, Toyama (JP); Iori Noda, Kawasaki (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 16/709,171

(22) Filed: Dec. 10, 2019

(65) Prior Publication Data

US 2020/0183291 A1    Jun. 11, 2020

Related U.S. Application Data

(63) Continuation of application No. 15/763,818, filed as application No. PCT/JP2016/078827 on Sep. 29, 2016, now abandoned.

(30) Foreign Application Priority Data

Sep. 30, 2015   (JP) .............................. JP2015-194827

(51) Int. Cl.
*G03F 7/20*     (2006.01)
*G01D 5/347*   (2006.01)

(52) U.S. Cl.
CPC ........ *G03F 7/70775* (2013.01); *G03F 7/7085* (2013.01); *G03F 7/70791* (2013.01); *G03F 7/70833* (2013.01); *G01D 5/34746* (2013.01)

(58) Field of Classification Search
CPC ............. G03F 7/70775; G03F 7/70791; G03F 7/70691; G03F 7/707; G03F 7/70716;
(Continued)

(56) References Cited

U.S. PATENT DOCUMENTS 5,729,331 A    3/1998 Tanaka et al.
6,552,775 B1   4/2003 Yanagihara et al.
(Continued)

FOREIGN PATENT DOCUMENTS

JP    H10-318791 A    12/1998
JP    2007-121277 A   5/2007
(Continued)

OTHER PUBLICATIONS

English translation of WO2009/103743, published Aug. 27, 2009. (Year: 2009).*
(Continued)

*Primary Examiner* — Christina A Riddle
(74) *Attorney, Agent, or Firm* — Oliff PLC

(57) ABSTRACT

A liquid crystal exposure apparatus that exposes a substrate with an illumination light via a projection optical system is equipped with: a substrate holder that holds the substrate; a substrate encoder system that includes head units and scales, and acquires the position information of the substrate holder on the basis of the output of the head units; and a drive section that relatively moves one of the head units and the scales on the substrate holder with respect to the other.

12 Claims, 16 Drawing Sheets

(58) Field of Classification Search
CPC .. G03F 7/70725; G03F 7/70758; G03F 7/708; G03F 7/70808; G03F 7/70825; G03F 7/70833; G03F 7/7085; G03F 7/709; G03F 7/70475; G03F 7/2053; G03F 7/20; G03F 7/706; G01D 5/34746
USPC ............. 355/52, 53, 55, 67–71, 72–77; 250/492.1, 492.2, 492.22, 493.1; 356/399–401, 614–624
See application file for complete search history.

(56) References Cited

U.S. PATENT DOCUMENTS

| | | | |
|---|---|---|---|
| 6,639,686 | B1 | 10/2003 | Ohara |
| 2002/0109823 | A1* | 8/2002 | Binnard ............ G03F 7/70716 355/53 |
| 2007/0069117 | A1 | 3/2007 | Sakagami et al. |
| 2008/0030702 | A1* | 2/2008 | Kawamura ......... G03F 7/70791 355/53 |
| 2008/0094592 | A1 | 4/2008 | Shibazaki |
| 2008/0129762 | A1 | 6/2008 | Shiomi |
| 2009/0316124 | A1 | 12/2009 | Kwan |
| 2010/0018950 | A1 | 1/2010 | Aoki et al. |
| 2010/0266961 | A1 | 10/2010 | Kawamura et al. |
| 2011/0026004 | A1* | 2/2011 | Van Eijk ............ G03B 27/58 355/72 |
| 2011/0053061 | A1 | 3/2011 | Shibazaki |
| 2012/0057140 | A1 | 3/2012 | Aoki |
| 2013/0177857 | A1 | 7/2013 | Shibazaki |
| 2015/0153742 | A1 | 6/2015 | Ko et al. |
| 2017/0108716 | A1* | 4/2017 | Shirato ............ G03F 7/20 |

FOREIGN PATENT DOCUMENTS

| | | | |
|---|---|---|---|
| JP | 2011-49557 A | 3/2011 | |
| JP | 2011-145150 A | 7/2011 | |
| JP | 2012-198372 A | 10/2012 | |
| JP | 2015-109079 A | 6/2015 | |
| TW | 201341965 A | 10/2013 | |
| WO | 2009103743 A1 | 8/2009 | |
| WO | WO-2009103743 A1 * | 8/2009 | ......... G01B 5/0004 |
| WO | 2010/122788 A1 | 10/2010 | |
| WO | 2013/100203 A2 | 7/2013 | |
| WO | 2015/147319 A1 | 10/2015 | |
| WO | WO-2015147319 A1 * | 10/2015 | ......... G03F 7/70716 |

OTHER PUBLICATIONS

Jan. 10, 2017 International Search Report issued in International Patent Application No. PCT/JP2016/078827.
Jan. 10, 2017 Written Opinion issued in International Patent Application No. PCT/JP2016/078827.
Jul. 10, 2019 Office Action issued in U.S. Appl. No. 15/763,818.
Nov. 29, 2018 Office Action Issued in U.S. Appl. No. 15/763,818.
Jun. 25, 2020 Office Action issued in Japanese Patent Application No. 2017-543562.
Jan. 19, 2021 Office Action issued in Japanese Patent Application No. 2017-543562.

* cited by examiner

EXPOSURE APPARATUS, MANUFACTURING METHOD OF FLAT-PANEL DISPLAY, DEVICE MANUFACTURING METHOD, AND EXPOSURE METHOD

This application is a continuation of U.S. application Ser. No. 15/763,818 filed Mar. 27, 2018, which is a National Stage Entry of International Patent Application No. PCT/JP2016/078827 filed Sep. 29, 2016, and claims priority under 35 U.S.C. 119 from Japanese Patent Application No. 2015-194827 filed on Sep. 30, 2015. The contents of the above applications are incorporated herein by reference.

TECHNICAL FIELD

The present invention relates to exposure apparatuses, manufacturing methods of flat-panel displays, device manufacturing methods and exposure methods, and more particularly to an exposure apparatus and an exposure method for exposing an object with an illumination light, and a manufacturing method of flat-panel displays or a device manufacturing method using the exposure apparatus.

BACKGROUND ART

Conventionally, in a lithography process for manufacturing electronic devices (micro devices) such as liquid crystal display devices and semiconductor devices (integrated circuits and the like), used are exposure apparatuses such as an exposure apparatus of a step-and-scan method (a so-called scanning stepper (which is also called a scanner)) that, while synchronously moving a mask (a photomask) or a reticle (hereinafter, generically referred to as a "mask") and a glass plate or a wafer (hereinafter, generically referred to as a "substrate") along a predetermined scanning direction (a scan direction), transfers a pattern formed on the mask onto the substrate using an energy beam.

As this type of exposure apparatuses, such an exposure apparatus is known that is equipped with an optical interferometer system that obtains the position information of a substrate serving as an exposure target, within a horizontal plane, using a bar mirror (a long mirror) that a substrate stage device has (e.g., refer to PTL 1).

Here, in the case of obtaining the position information of a substrate using the optical interferometer system, the influence of so-called air fluctuation cannot be ignored. Further, although the influence of the air fluctuation can be reduced by using an encoder system, it is difficult to prepare a scale that can cover the entire movement range of a substrate due to the increase in size of the substrate in recent years.

CITATION LIST

Patent Literature

[PTL 1] U.S. Patent Application Publication No. 2010/0266961

SUMMARY OF INVENTION

According to a first aspect of the present invention, there is provided an exposure apparatus that exposes an object with an illumination light via a projection optical system, the apparatus comprising: a holding section that holds the object; a position measurement section that includes a measuring section and a measured section, and acquires position information of the holding section based on an output of the measuring section; and a first drive section that relatively moves one of the measuring section and the measured section on the holding section, with respect to the other of the measuring section and the measured section.

According to a second aspect of the present invention, there is provided a manufacturing method of a flat-panel display, comprising: exposing the object using the exposure apparatus related to the first aspect; and developing the object that has been exposed.

According to a third aspect of the present invention, there is provided a device manufacturing method, comprising: exposing the object using the exposure apparatus related to the first aspect; and developing the object that has been exposed.

According to a fourth aspect of the present invention, there is provided an exposure method of exposing an object with an illumination light via a projection optical system, the method comprising: acquiring position information of a holding section that holds the object, based on an output of a measuring section of a position measurement section that includes the measuring section and a measured section; and relatively moving one of the measuring section and the measured section on the holding member with respect to the other of the measuring section and the measured section, using a first drive section.

DESCRIPTION OF EMBODIMENTS

First Embodiment

A first embodiment will be described below, using FIGS. 1 to 10B.

Figure 1:
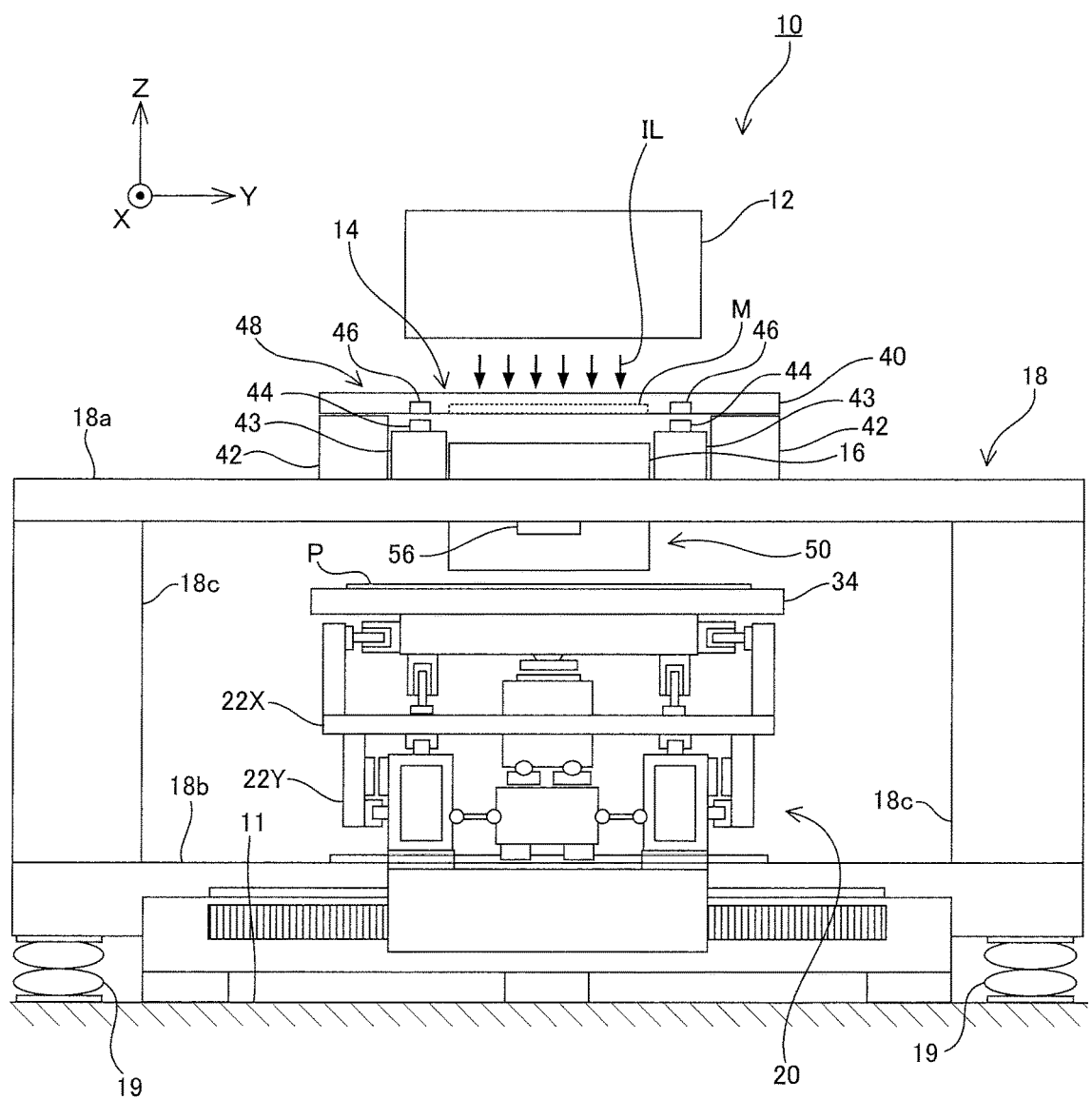
FIG. 1 is a view schematically showing a configuration of a liquid crystal exposure apparatus related to a first embodiment.

FIG. 1 schematically shows the configuration of a liquid crystal exposure apparatus 10 related to the first embodiment. Liquid crystal exposure apparatus 10 is a projection exposure apparatus of a step-and-scan method, which is a so-called scanner, with a rectangular (square) glass substrate P (hereinafter, simply referred to as a substrate P) used in, for example, a liquid crystal display device (a flat-panel display) or the like, serving as an object to be exposed.

Liquid crystal exposure apparatus 10 has: an illumination system 12; a mask stage device 14 to hold a mask M on which patterns such as a circuit pattern are formed; a projection optical system 16; an apparatus main body 18; a substrate stage device 20 to hold substrate P whose surface (a surface facing the +Z side in FIG. 1) is coated with resist (sensitive agent); a control system thereof; and the like. Hereinafter, the explanation is given assuming that a direction in which mask M and substrate P are each scanned relative to projection optical system 16 at the time of exposure is an X-axis direction, a direction orthogonal to the X-axis within a horizontal plane is a Y-axis direction, a direction orthogonal to the X-axis and the Y-axis is a Z-axis direction, and rotation directions around the X-axis, the Y-axis and the Z-axis are a θx direction, a θy direction and a θz direction, respectively. Further, the explanation is given assuming that the positions in the X-axis direction, the Y-axis direction and the Z-axis direction are an X-position, a Y-position and a Z-position, respectively.

Illumination system 12 is configured similarly to an illumination system disclosed in, for example, U.S. Pat. No. 5,729,331 and the like. Illumination system 12 irradiates mask M with light emitted from a light source (not illustrated) (e.g. a mercury lamp), as illumination light for exposure (illumination light) IL, via a reflection mirror, a dichroic mirror, a shutter, a wavelength selecting filter, various types of lenses and the like (none of which are illustrated).

As illumination light IL, light such as, for example, an i-line (with wavelength of 365 nm), a g-line (with wavelength of 436 nm), and an h-line (with wavelength of 405 nm) (or synthetic light of the i-line, the g-line and the h-line described above) is used.

Mask stage device 14 includes: a mask holder 40 that holds mask M by, for example, vacuum adsorption; a mask driving system 91 (not illustrated in FIG. 1, see FIG. 7) for driving mask holder 40 with a predetermined long stroke in the scanning direction (the X-axis direction), and also finely driving mask holder 40 in the Y-axis direction and the Oz direction as needed; and a mask position measurement system for obtaining the position information within the XY plane (including also rotation amount information in the Oz direction, the same applying hereinafter) of mask holder 40. Mask holder 40 is made up of a frame-like member in which an opening section with a rectangular shape in planar view is formed, as disclosed in, for example, U.S. Patent Application Publication No. 2008/0030702. Mask holder 40 is placed, for example, via air bearings (not illustrated), on a pair of mask guides 42 fixed to an upper mount section 18a that is a part of apparatus main body 18. Mask driving system 91 includes, for example, a linear motor (not illustrated).

The mask position measurement system is equipped with a mask encoder system 48 that includes: a pair of encoder head units 44 (hereinafter, simply referred to as head units 44) that are fixed to upper mount section 18a via encoder bases 43; and a plurality of encoder scales 46 (the scales overlap each other in the depth direction of the page surface in FIG. 1, see FIG. 2A) that are disposed on the lower surface of mask holder 40, corresponding to the pair of head units 44 referred to above. The configuration of mask encoder system 48 will be described in detail later.

Projection optical system 16 is disposed below mask stage device 14. Projection optical system 16 is a so-called multilens type projection optical system having a configuration similar to a projection optical system disclosed in, for example, U.S. Pat. No. 6,552,775 and the like, and projection optical system 16 is equipped with a plurality (e.g. eleven in the present embodiment, see FIG. 2A) of optical systems that are, for example, both-side telecentric unmagnification systems, and form erected normal images.

In liquid crystal exposure apparatus 10, when an illumination area on mask M is illuminated with illumination light IL from illumination system 12, by the illumination light that has passed through mask M, a projected image (a partial erected image) of a circuit pattern of mask M within the illumination area is formed, via projection optical system 16, on an irradiation area (an exposure area) of the illumination light, on substrate P, that is conjugate with the illumination area. Then, mask M is moved relative to the illumination area (illumination light IL) in the scanning direction and also substrate P is moved relative to the exposure area (illumination light IL) in the scanning direction, and thereby the scanning exposure of one shot area on substrate P is performed and the pattern formed on mask M is transferred onto the shot area.

Apparatus main body 18 supports mask stage device 14 and projection optical system 16 described above, and is installed on a floor 11 of a clean room via a plurality of vibration isolating devices 19. Apparatus main body 18 is configured similarly to an apparatus main body as disclosed in, for example, U.S. Patent Application Publication No. 2008/0030702, and apparatus main body 18 has: upper mount section 18a (which is also referred to as an optical surface plate) that supports projection optical system 16 described above; a lower mount section 18b; and a pair of middle mount sections 18c.

Substrate stage device 20 is a device for performing the high accuracy positioning of substrate P relative to projection optical system 16 (illumination light IL), and substrate stage device 20 drives substrate P with a predetermined long stroke along the horizontal plane (the X-axis direction and the Y-axis direction), and also finely drives substrate P in directions of six degrees of freedom. Although the configuration of substrate stage device 20 is not particularly limited, it is preferable to use a stage device having a so-called coarse-fine movement configuration that includes a gantry type two-dimensional coarse movement stage and a fine movement stage that is finely driven relative to the two-dimensional coarse movement stage, as disclosed in, for example, U.S. Patent Application Publication No. 2008/0129762 or U.S. Patent Application Publication No. 2012/0057140, and the like.

Substrata stage device 20 is equipped with a Y coarse movement stage 22Y, an X coarse movement stage 22X and a substrate holder 34. Y coarse movement stage 22Y is driven with a predetermined long stroke relative to projection optical system 16 in the Y-axis direction via, for example, a Y actuator or the like. X coarse movement stage 22x is driven with a predetermined long stroke in the X-axis direction on Y coarse movement stage 22Y via, for example, an X actuator or the like. X coarse movement stage 22X is moved integrally with Y coarse movement stage 22Y in Y-axis direction. Substrate holder 34 is made up of a plate-like member with a rectangular shape in planar view and substrate p is placed on the upper surface of substrate holder 34. Substrate holder 34 is driven with a predetermined long stroke integrally with X coarse movement stage 22X relative to projection optical system 16 in the X-axis direction and/or the Y-axis direction and is also finely driven in the directions of six degrees of freedom, by a plurality of fine movement actuators (e.g. voice coil motors). The Y actuator, the X actuator and the fine movement actuators referred to above configure a part of a substrate driving system 93 (see FIG. 7).

Figure 7:
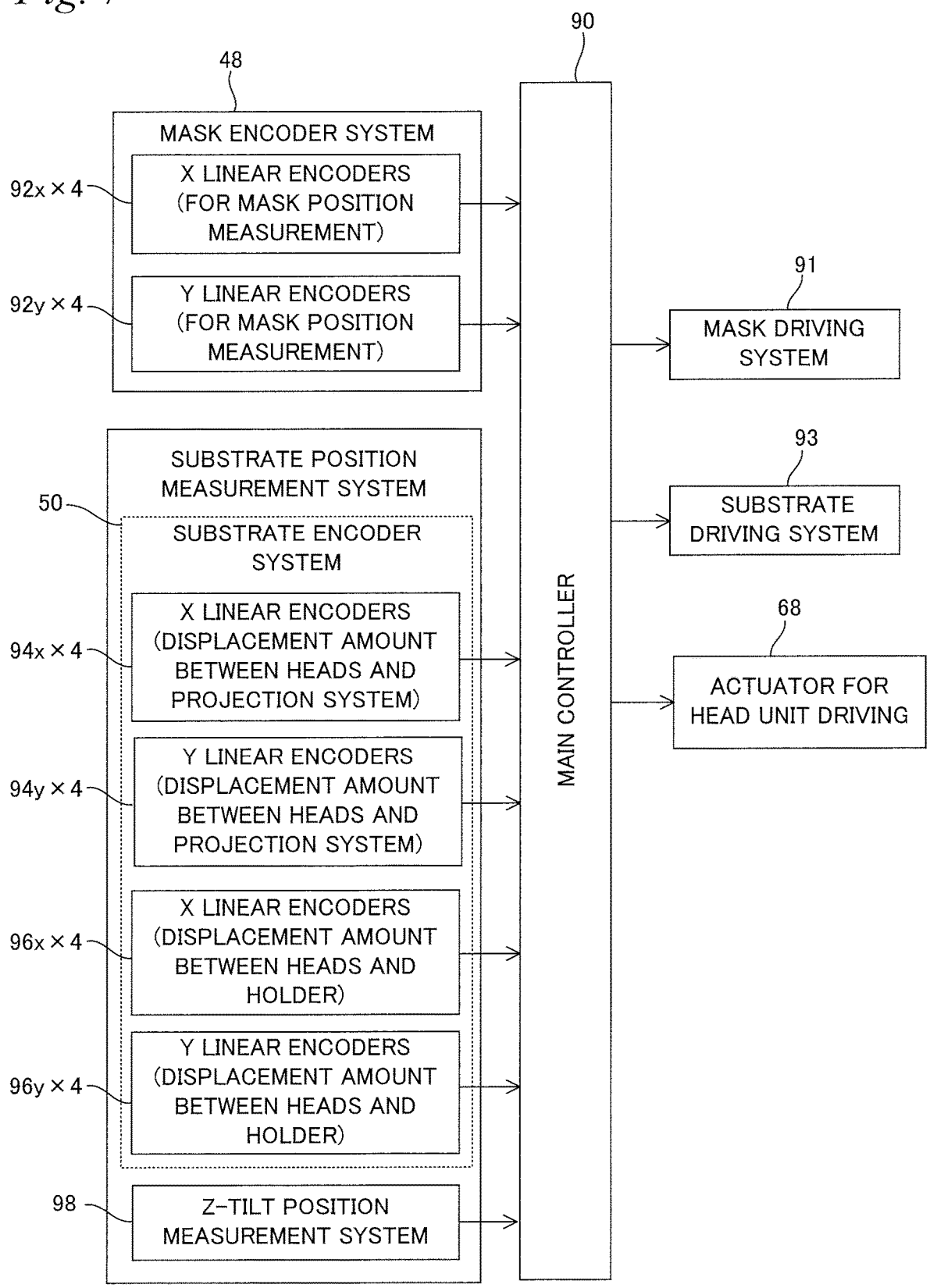
FIG. 7 is a block diagram showing the input/output relationship of a main controller that centrally configures a control system of the liquid crystal exposure apparatus.

Further, liquid crystal exposure apparatus 10 has a substrate position measurement system for obtaining the position information of substrate holder 34 (i.e. substrate P) in the directions of six degrees of freedom. As illustrated in FIG. 7, the substrate position measurement system includes a Z-tilt position measurement system 98 for obtaining the position information of substrate P in the Z-axis direction, the θx direction and the θy direction (hereinafter, referred to as Z-tilt directions), and a substrate encoder system 50 for obtaining the position information of substrate P within the XY plane. Although the configuration of Z-tilt position measurement system 98 is not particularly limited, such a measurement system can be used that obtains the position information of substrate P in the Z-tilt directions with apparatus main body 18 (e.g. lower mount section 18b) serving as a reference, using a plurality of sensors attached to a system including substrate holder 34, as disclosed in, for example, U.S. Patent Application Publication No. 2010/0018950. The configuration of substrate encoder system 50 will be described later.

Next, the configuration of mask encoder system 48 will be described using FIGS. 2A and 2B. As typically shown in FIG. 2A, a plurality of encoder scales 46 (hereinafter, simply referred to as scales 46) are disposed in each of an area on the +Y side and an area on the −Y side of mask M (to be more detailed, an opening section (not illustrated) for accommodating mask M) on mask holder 40. Note that the plurality of scales 46 are illustrated in solid lines and illustrated as if they are disposed on the upper surface of mask holder 40 in FIG. 2A in order to facilitate the understanding, but in actuality the plurality of scales 46 are disposed on the lower surface side of mask holder 40 so that the Z-position of the lower surface of each of the plurality of scales 46 and the Z-position of the lower surface (the pattern surface) of mask M coincide with each other, as illustrated in FIG. 1.

In mask holder 40 of the present embodiment, for example, three scales 46 are disposed at a predetermined spacing in the X-axis direction, in each of the area on the +Y side and the area on the −Y side of mask M. That is, mask holder 40 has, for example, a total of six scales 46. The plurality of scales 46 are substantially the same except that scales 46 on the +Y side and scales 46 on the −Y side are disposed vertically symmetric on the page surface. Scale 46 is made up of a plate-like (band-like) member formed of quartz glass and having a rectangular shape in planar view extending in the X-axis direction. Mask holder 40 is, for example, formed of ceramic, and the plurality of scales 46 are fixed to mask holder 40.

Figure 2A:
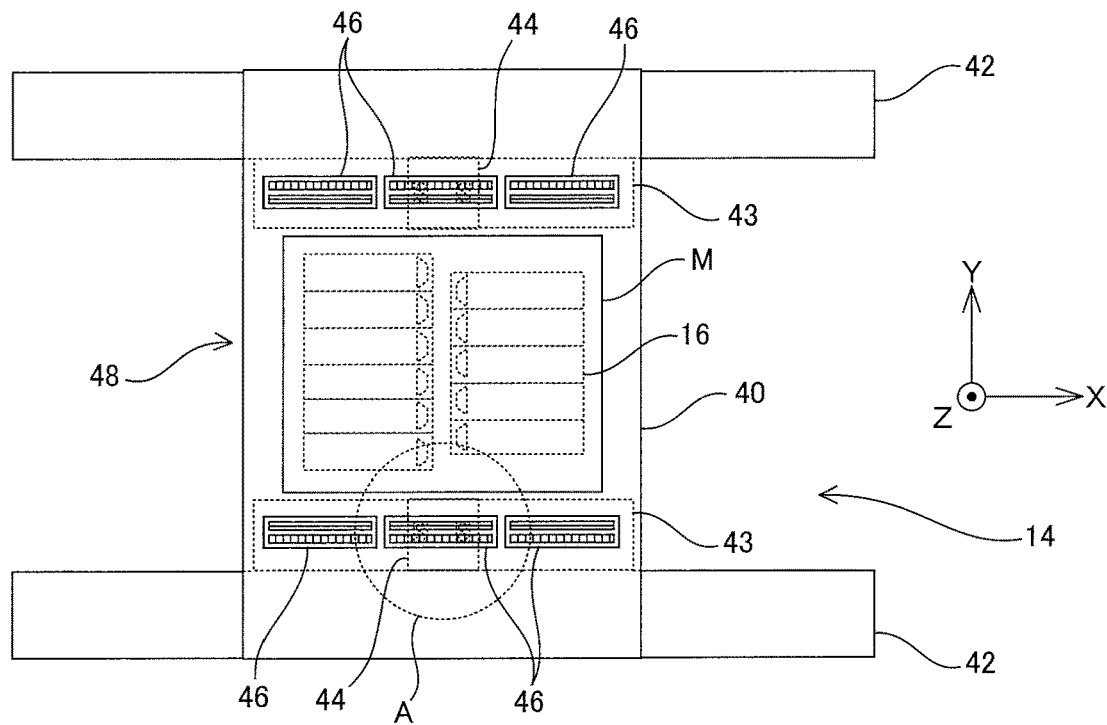
FIG. 2A is a view schematically showing a configuration of a mask encoder system equipped in the liquid crystal exposure apparatus shown in FIG. 1.
Figure 2B:
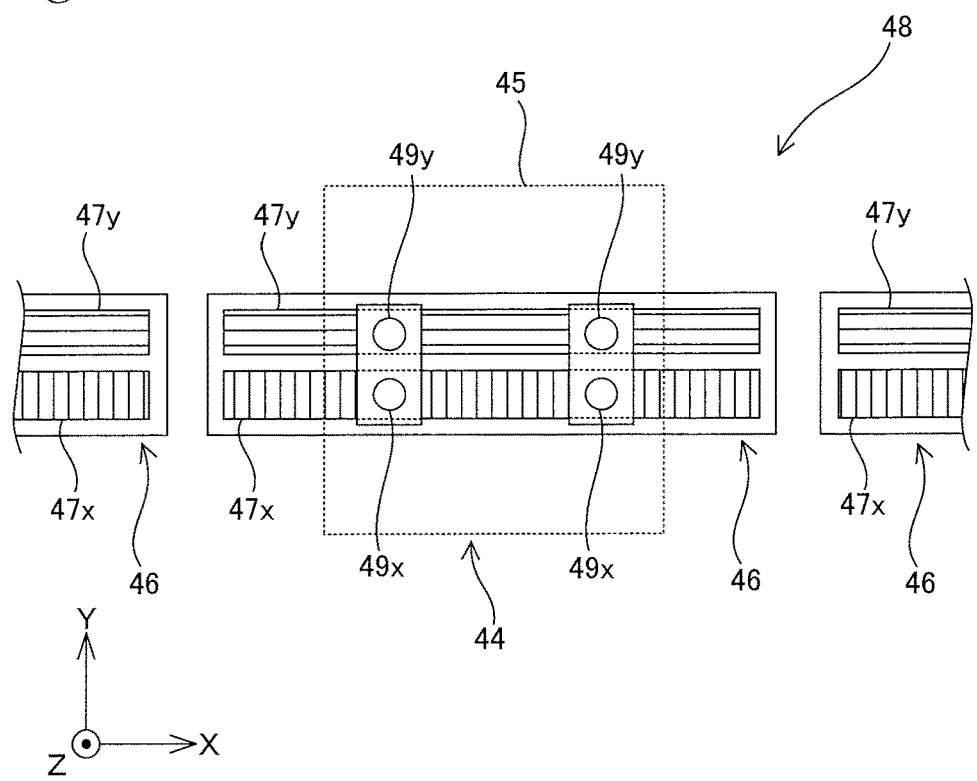
FIG. 2B is an enlarged view of a part (an Apart shown in FIG. 2A) of the mask encoder system.

As illustrated in FIG. 2B, in an area on one side in the width direction (on the −Y side in FIG. 2B) on the lower surface (the surface facing the −Z side in the present embodiment) of scale 46, an X scale 47x is formed. And, in an area on the other side in the width direction (on the +Y side in FIG. 2B) on the lower surface of scale 46, a Y scale 47y is formed. X scale 47x is configured of a reflective diffraction grating (an X grating) having a plurality of grid lines formed at predetermined pitch in the X-axis direction (with the X-axis direction serving as a period direction) and extending in the Y-axis direction. Similarly, Y scale 47y is configured of a reflective diffraction grating (a Y grating) having a plurality of grid lines formed at predetermined pitch in the Y-axis direction (with the Y-axis direction serving as a period direction) and extending in the X-axis direction. In X scale 47x and Y scale 47y of the present embodiment, the plurality of grid lines are formed with a spacing of, for example, 10 nm or less. Note that, in FIGS. 2A and 2B, the spacing (the pitch) between the grid lines is illustrated remarkably wider than the actual one, for the sake of convenience in illustration. The same applies to the other drawings.

Further, as illustrated in FIG. 1, a pair of encoder bases 43 are fixed on the upper surface of upper mount section 18a. One of the pair of encoder bases 43 is disposed on the −Y side of mask guide 42 on the +Y side, while the other is disposed on the +Y side of mask guide 42 on the −Y side (i.e. in an area between the pair of mask guides 42). Further, a part of projection optical system 16 described above is disposed between the pair of encoder bases 43. As illustrated in FIG. 2A, encoder base 43 is made up of a member extending in the X-axis direction. Encoder head unit 44 (hereinafter, simply referred to as head unit 44) is fixed to the central part in the longitudinal direction of each of the pair of encoder bases 43. That is, head unit 44 is fixed to apparatus main body 18 (see FIG. 1) via encoder base 43. Since the pair of head units 44 are substantially the same except that head unit 44 on the +Y side of mask M and head unit 44 on the −Y side of mask M are disposed vertically symmetric on the page surface, only one of them (on the −Y side) will be described below.

As illustrated in FIG. 2B, head unit 44 has a unit base 45 made up of a plate-like member with a rectangular shape in planar view. A pair of X heads 49x disposed spaced apart in the X-axis direction and a pair of Y heads 49y disposed spaced apart in the X-axis direction are fixed to unit base 45. That is, mask encoder system 48 has, for example, four X heads 49x and also has, for example, four Y heads 49y. Note that, although one of X heads 49x and one of Y heads 49y are accommodated in one housing, and the other of X heads 49x and the other of Y heads 49y are accommodated in another housing in FIG. 2B, the pair of X heads 49x and the pair of Y heads 49y described above may be disposed independently from each other. Further, the pair of X heads 49x and the pair of Y heads 49y are illustrated as if they are disposed above (on the +Z side) of scale 46 in FIG. 2B, in order to facilitate the understanding. In actuality, however, the pair of X heads 49x and the pair of Y heads 49y are disposed below X scale 47x and below Y scale 47y, respectively (see FIG. 1).

The pair of X heads 49x and the pair of Y heads 49y are fixed to unit base 45 so that a distance between the pair of X heads 49x and a distance between the pair of Y heads 49y are prevented from changing due to, for example, vibration or the like. Also, unit base 45 itself is formed of a material with a thermal expansion coefficient lower than (or equal to) that of scale 46 so that the distance between the pair of X heads 49x and the distance between the pair of Y heads 49y are prevented from changing due to, for example, a change in temperature or the like.

X heads 49x and Y heads 49y are encoder heads of a so-called diffraction interference method, like those disclosed in, for example, U.S. Patent Application Publication No. 2008/0094592, and supply displacement amount information of mask holder 40 (i.e. mask M, see FIG. 2A) to a main controller 90 (see FIG. 7), by irradiating the corresponding scales (X scales 47x and Y scales 47y) with measurement beams and receiving the beams from the scales. That is, in mask encoder system 48, for example, the four X heads 49x and X scales 47x (which differ depending on the X-position of mask holder 40) that face these X heads 49x configure, for example, four X linear encoders 92x (not illustrated in FIG. 2B, see FIG. 7) for obtaining the position information of mask M in the X-axis direction, and for example, the four Y heads 49y and Y scales 47y (which differ depending on the X-position of mask holder 40) that face these Y heads 49y configure, for example, four Y linear encoders 92y (not illustrated in FIG. 2B, see FIG. 7) for obtaining the position information of mask M in the Y-axis direction.

Main controller 90 obtains the position information of mask holder 40 (see FIG. 2A) in the X-axis direction and the Y-axis direction with, for example, a resolution of 10 nm or less, on the basis of the outputs of, for example, the four X linear encoder 92x and, for example, the four Y linear encoders 92y, as illustrated in FIG. 7. Further, main controller 90 obtains the Oz position information (the rotation amount information) of mask holder 40, on the basis of the outputs of at least two of, for example, the four X linear encoders 92x (or of, for example, the four Y linear encoders 92y). Main controller 90 controls the position of mask holder 40 within the XY plane using mask driving system 91, on the basis of the position information of mask holder 40 within the XY plane that has been obtained from the measurement values of mask encoder system 48 described above.

Here, as illustrated in FIG. 2A, in mask holder 40, for example, three scales 46 are disposed at a predetermined spacing in the X-axis direction, in each of the area on the +Y side and the area on the −Y side of mask M, as is described above. Then, in mask stage device 14 of the present embodiment, as illustrated in FIG. 2B, a spacing between the pair of X heads 49x and a spacing between the pair of Y heads 49y that one head unit 44 has are set wider than a spacing between scales 46 adjacent to each other. Accordingly, in mask encoder system 48, at least one of the pair of X heads 49x constantly faces X scale 47x, and at least one of the pair of Y heads 49y constantly faces Y scale 47y. Consequently, mask encoder system 48 can supply the position information of mask holder 40 (see FIG. 2A) to main controller 90 (see FIG. 7) without interruption.

Specifically, for example, in the case where mask holder 40 (see FIG. 2A) is moved to the +X side, mask encoder system 48 undergoes transition in the order of the following states: a first state (a state illustrated in FIG. 2B) where both of the pair of X heads 49x face X scale 47x on the +X side of a pair of X scales 47x adjacent to each other; a second state where X head 49x on the −X side faces an area between the forgoing pair of X scales 47x adjacent to each other (does not face any one of X scales 47x) and X head 49x on the +X side faces the forgoing X scale 47x on the +X side; a third state where X head 49x on the −X side faces X scale 47x on the −X side and also X head 49x on the +X side faces X scale 47x on the +X side; a fourth state where X head 49x on the −X side faces X scale 47x on the −X side and X head 49 on the +X side faces an area between the pair of X scales 47x (does not face any one of X scales 47x); and a fifth state where both of the pair of heads 49x face X scale 47x on the −X side. Consequently, at least one of X heads 49x constantly faces X scale 47x.

Main controller 90 (see FIG. 7) obtains the X-position information of mask holder 40 on the basis of the average value of the outputs of the pair of X heads 49x in the first state, the third state and the fifth state described above. Further, main controller 90 obtains the X-position information of mask holder 40 on the basis of only the output of X head 49x on the +X side in the second state described above, and obtains the X-position information of mask holder 40 on the basis of only the output of X head 49x on the −X side in the fourth state described above. Consequently, the measurement values of mask encoder system 48 are not interrupted.

To be more detailed, in mask encoder system 48 of the present embodiment, in order to prevent the measurement values of mask encoder system 48 from being interrupted, the linkage processing of the outputs of the heads is performed, when the transition is made between: the first, the third and the fifth states described above, i.e., the states where both of the pair of heads face the scale and the output is supplied from each of the pair of heads; and the second and the fourth states described above, i.e., the states where only one of the pair of heads faces the scale and the output is supplied from the only one head. The linkage processing of the heads will be described below, using FIGS. 3A and 3E. Note that, for the sake of simplified explanation, a two-dimensional grating (a grating) is assumed to be formed on scale 46 in FIGS. 3A to 3E. Further, the outputs of each of heads 49X and 49Y are assumed to show the ideal values. Further, in the description below, although the linkage processing regarding a pair of X heads 49X adjacent to each other (referred to as heads $49X_1$ and $49X_2$ for the sake of convenience) will be described, the similar linkage processing is also performed between a pair of Y heads 49Y adjacent to each other (referred to as heads $49Y_1$ and $49Y_2$ for the sake of convenience).

Figure 3A:
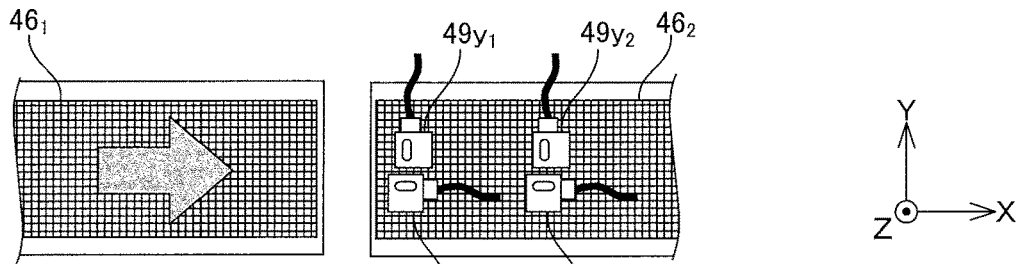
FIGS. 3A to 3E are views (No. 1 to No. 5) used to explain the linkage processing of head outputs in the mask encoder system and a substrate encoder system.
Figure 3B:
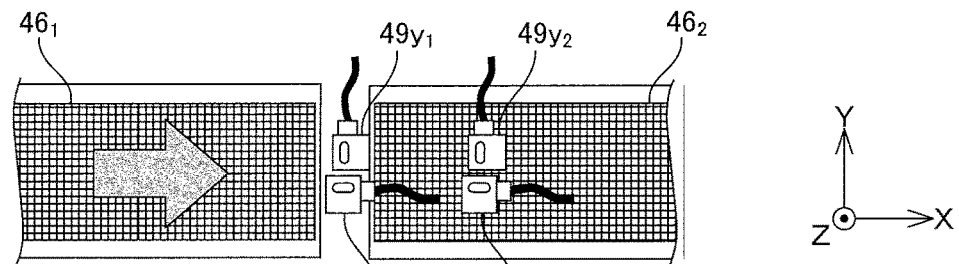

As illustrated in FIG. 3A, in the case where, of a pair of scales 46 adjacent to each other (referred to as $46_1$ and $46_2$ for the sake of convenience), each of the pair of X heads $49X_1$ and $49X_2$ obtains the X-position information of mask holder 40 (see FIG. 2A) using scale $46_2$ on the +X side, the pair of X heads $49X_1$ and $49X_2$ both output X-coordinate information. Here, the outputs of the pair of X heads $49X_1$ and $49X_2$ show the same value. Subsequently, as illustrated in FIG. 3B, when mask holder 40 is moved to the +X direction, X head $49X_1$ will be out of a measurement range of scale $46_2$, and therefore before X head $49X_1$ is out of the measurement range, the output of X head $49X_1$ is treated as an invalid output. Consequently, the X-position information of mask holder 40 is obtained on the basis of only the output of X head $49X_2$.

Figure 3C:
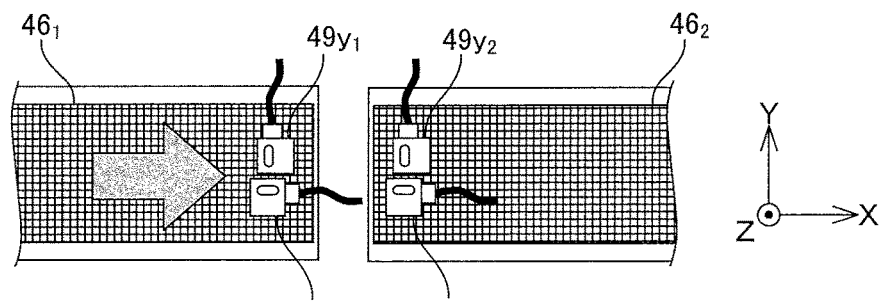

As illustrated in FIG. 3C, when mask holder 40 (see FIG. 2A) is moved further to the +X direction, X head $49X_1$ faces scale $46_1$ on the −X side. Immediately after coming into a state of capable of performing a measurement operation using scale $46_1$, X head $49X_1$ outputs the X-position information of mask holder 40. However, since the counting of the output of X head $49X_1$ is resumed from an undefined value (or zero), the X-position information of X head $49X_1$ cannot be used in computation of the X-position information of mask holder 40. Consequently, in this state, the linkage processing of the respective outputs of the pair of X heads $49X_1$ and $49X_2$ is needed. Specifically, as the linkage processing, the processing of correcting the output of X head $49X_1$ that shows the undefined value (or zero) using the output of X head $49X_2$ (e.g., so that the outputs show the same value) is performed. The linkage processing is completed before mask holder 40 is moved further to the +X direction and X head $49X_2$ is out of the measurement range of scale $46_2$, as illustrated in FIG. 3D.

Figure 3D:
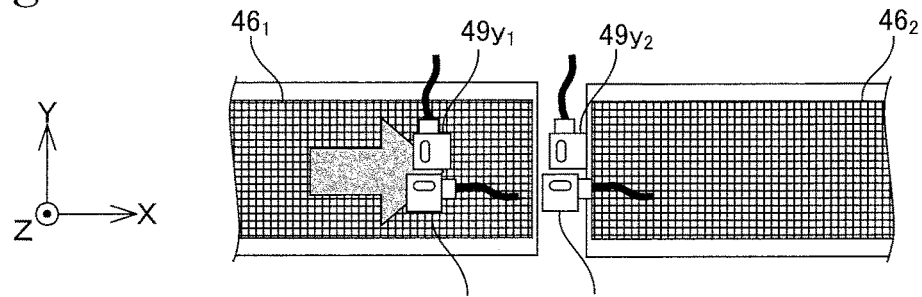
Figure 3E:
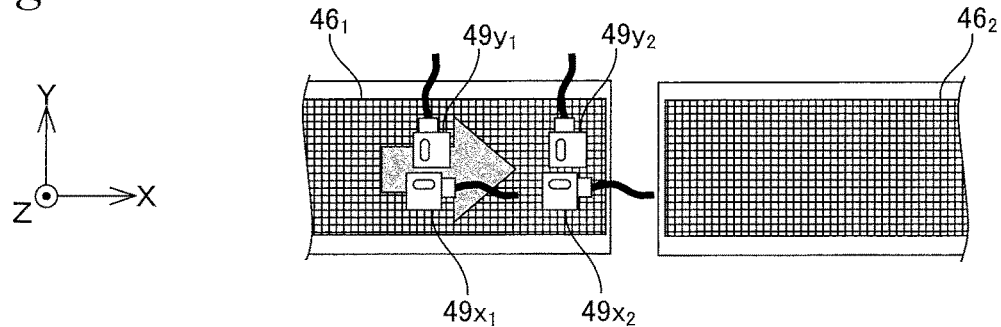

Similarly, as illustrated in FIG. 3D, in the case where X head $49X_2$ will be out of the measurement range of scale $46_2$, the output of X head $49X_2$ is treated as an invalid output before X head $49X_2$ is out of the measurement range. Consequently, the X-position information of mask holder 40 (see FIG. 2A) is obtained on the basis of only the output of X head $49X_1$. Then, as illustrated in FIG. 3E, mask holder 40 is moved further to the +X direction, and immediately after each of the pair of X heads $49X_1$ and $49X_2$ comes into a state capable of performing a measurement operation using scale $46_1$, the linkage processing using the output of X head $49X_1$ is performed with respect to X head $49X_2$. After that, the X-position information of mask holder 40 is obtained on the basis of the output of each of the pair of X heads $49X_1$ and $49X_2$.

Figure 4A:
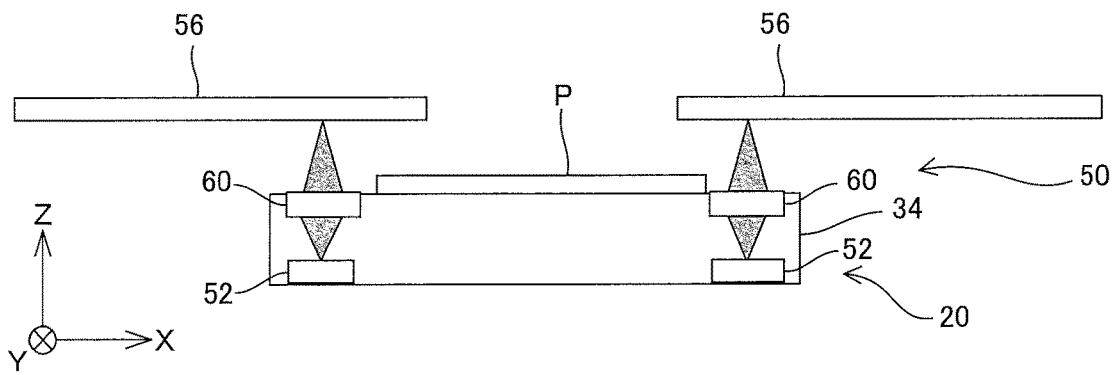
FIGS. 4A and 4B are concept views (a side view and a plan view, respectively) of the substrate encoder system related to the first embodiment.
Figure 4B:
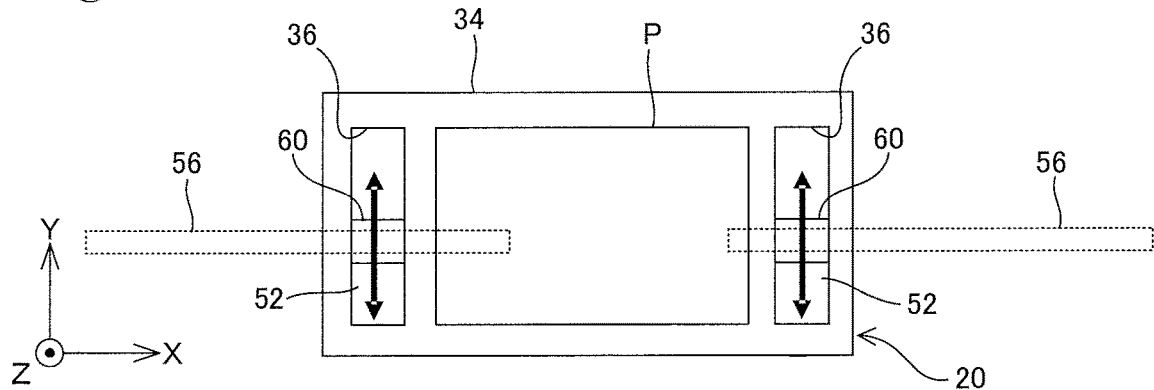

Next, the configuration of substrate encoder system 50 will be described. In FIGS. 4A and 4B, the concept views of substrate encode system 50 are shown. In mask encoder system (see FIG. 2A) described above, mask holder 40 holding a plurality of scales 46 is moved relative to the pair of head units 44 whose positions are fixed, whereas in substrate encoder system 50, substrate stage device 20 (substrate holder 34 in the present embodiment) has a pair of head units 60.

Further, the pair of head units 60 are capable of being relatively driven with a predetermined stroke with respect to substrate holder 34 (see arrows in FIG. 4B), by an actuator for head unit driving 68 (see FIG. 7) provided at substrate holder 34. The type of actuator for head unit driving 68 is not particularly limited, and for example, a linear motor, a feed screw device or the like can be used. Further, the relative movement of the pair of head units 60 with respect to substrate holder 34 in the X-axis direction is, for example, mechanically restricted. Consequently, when substrate holder 34 is moved with along stroke in the X-axis direction, the pair of head units 60 are moved with a long stroke integrally with substrate holder 34 in the X-axis direction. However, even when head units 60 and substrate holder 34 are moved integrally with a long stroke in the X-axis direction, the relative movement of the pair of head units 60 with respect to substrate holder 34 in the Y-axis direction is not blocked.

Herein, as illustrated in FIG. 1, a plurality of scales 56 (which overlap in the depth direction of the page surface in FIG. 1) are fixed on the lower surface of upper mount section 18a. As illustrated in FIG. 4A, scale 56 is made up of a member extending in the X-axis direction. On the other hand, head unit 60 has a plurality of encoder heads (the details of the encoder heads will be described later), similarly to head unit 44 in mask encoder system 48 described above. When substrate holder 34 is moved in the Y-axis direction, main controller 90 (see FIG. 7) controls the Y-positions of head units 60 so that the facing state between head units 60 and scales 56 is maintained. When substrate holder 34 is moved in the X-axis direction in this facing state, head units 60 are also integrally moved in the X-axis direction, and therefore, the facing state between head units 60 and scales 56 is maintained. Consequently, the facing state between head units 60 and scales 56 is maintained irrespective of the position of substrate holder 34 within the XY plane. Head units 60 obtain the position information of head units 60 relative to upper mount section 18a (see FIG. 1) within the XY plane, by a part (the upward heads) of the plurality of encoder heads, using the plurality of scales 56 (see FIG. 4A).

Further, a pair of recessed sections 36 (see FIG. 4B) are formed at substrate holder 34, and the pair of head units 60 described above are disposed inside the pair of recessed sections 36, respectively. Further, a plurality of encoder scales 52 (hereinafter, simply referred to as scales 52) are fixed on the bottom surfaces of recessed sections 36. Head units 60 obtain the position information of head units 60 themselves relative to substrate holder 34 within the XY plane, by the other part (the downward heads) of the plurality of encoder heads (see FIG. 4A), using the plurality of scales 52. Main controller 90 (see FIG. 7) obtains the position information of substrate holder 34 within the XY plane with upper mount section 18a (see FIG. 1) serving as a reference, on the basis of the outputs of the upward heads described above and the outputs of the downward heads described above.

Figure 4C:
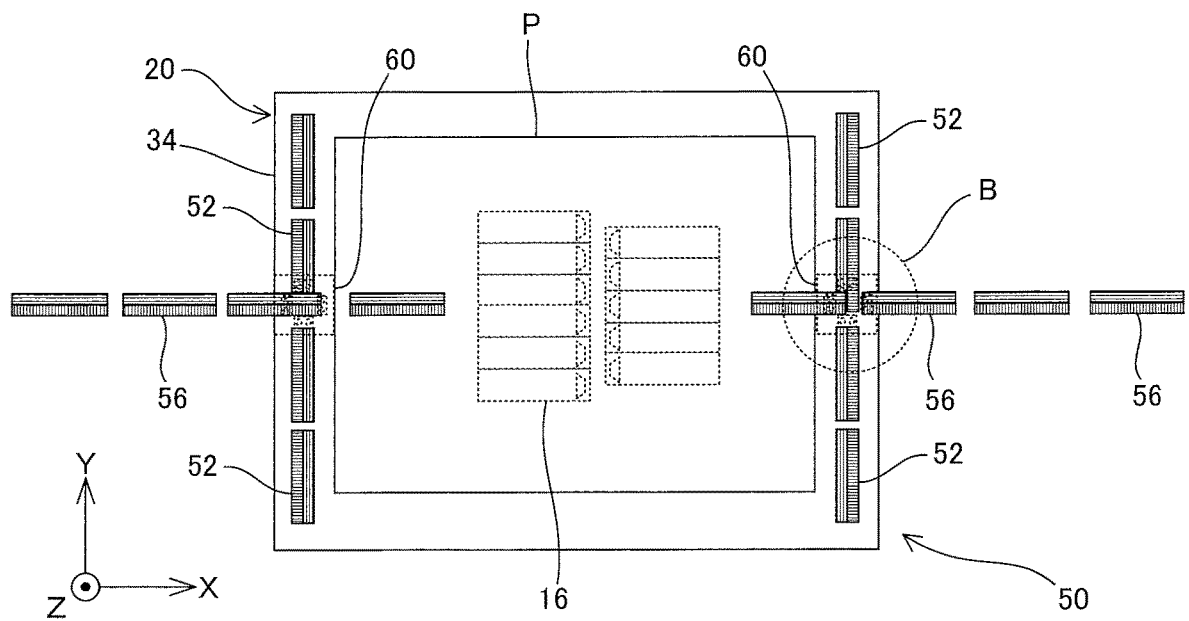
FIG. 4C is a view showing a specific example of the substrate encoder system.

An example of further embodying the concept of substrate encoder system 50 shown in FIGS. 4A and 4B will be described below. As illustrated in FIG. 4C, in substrate stage device 20 of the present embodiment, for example, four scales 52 are disposed at a predetermined spacing in the Y-axis direction, in each of an area on the +X side and an area on the −X side of substrate P. That is, substrate stage device 20 has, for example, a total of eight scales 52. A plurality of scales 52 are substantially the same except that scales 52 on the +X side of substrate P and scales 52 on the −X side of substrate P are laterally symmetrically disposed on the page surface. Scale 52 is made up of a plate-like (band-like) member formed of quartz glass and having a rectangular shape in planar view extending in the Y-axis direction, similarly to scale 46 of mask encoder system 48 describe above (see FIG. 2A for each of them).

Note that, in the present embodiment, the case where the plurality of scales 52 are fixed in recessed sections 36 (see FIG. 4B) of substrate holder 34 will be described, but the position where the plurality of scales 52 are disposed is not limited thereto, and for example, the plurality of scales 52 may be disposed on the outer side of substrate holder 34, separately from the substrate holder with a predetermined gap in between (however, in a manner such that the plurality of scales 52 are moved integrally with substrate holder 34 in the directions of six degrees of freedom).

Figure 5A:
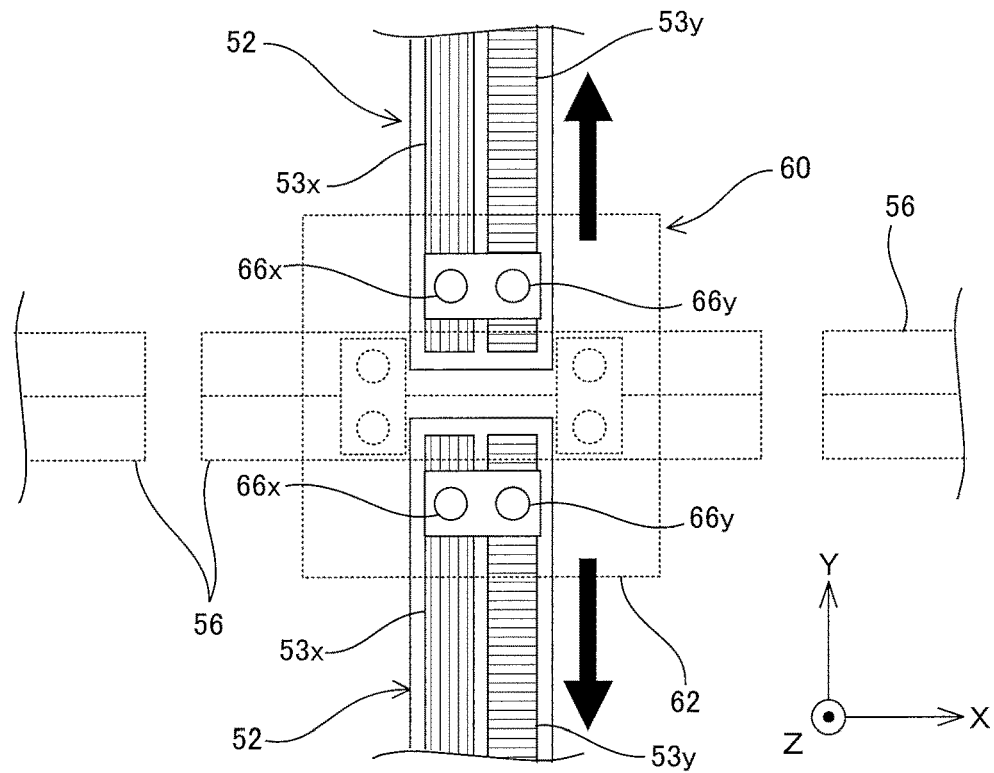
FIGS. 5A and 5B are enlarged views of a part (a B part shown in FIG. 4C) of the substrate encoder system.

As illustrated in FIG. 5A, an X scale 53x is formed in an area on one side in a width direction (on the −X side in FIG. 5A) on the upper surface of scale 52. Further, a Y scale 53y is formed in an area on the other side in the width direction (on the +X side in FIG. 5A) on the upper surface of scale 52. Since the configurations of X scale 53x and Y scale 53y are the same as the configurations of X scale 47x and Y scale 47y (see FIG. 2B for each of them), respectively, formed on scale 46 of mask encoder system 48 described above (see FIG. 2A for each of them), the description thereof will be omitted.

Further, on the lower surface of upper mount section 18*a* of apparatus main body 18 (see FIG. 1 for each of them), a plurality of encoder scales 56 (hereinafter, simply referred to as scales 56) are fixed. In the present embodiment, the Y-positions of scales 56 roughly coincide with the center position of projection optical system 16 in the Y-axis direction, as illustrated in FIG. 1. As illustrated in FIG. 4C, for example, four scales 56 are disposed in an area on the further +X side than projection optical system 16 and, for example, four scales 56 are disposed in an area on the further −X side than projection optical system 16, spaced apart from each other in the X-axis direction. That is, on the lower surface of upper mount section 18*a*, for example, a total of eight scales 56 are disposed. A plurality of scales 56 are substantially the same. Scale 56 is made up of a plate-like (band-like) member with a rectangular shape in planar view extending in the X-axis direction, and is formed of, for example, quartz glass, which is similar to scales 52 disposed on substrate stage device 20. Note that, although the plurality of scales 56 are illustrated in solid lines and the grating surfaces are illustrated upward (facing the +Z direction) in FIGS. 4C and 5B in order to facilitate the understanding, the grating surfaces of the plurality of scales 56 face downward (the −Z side) in actuality.

Figure 5B:
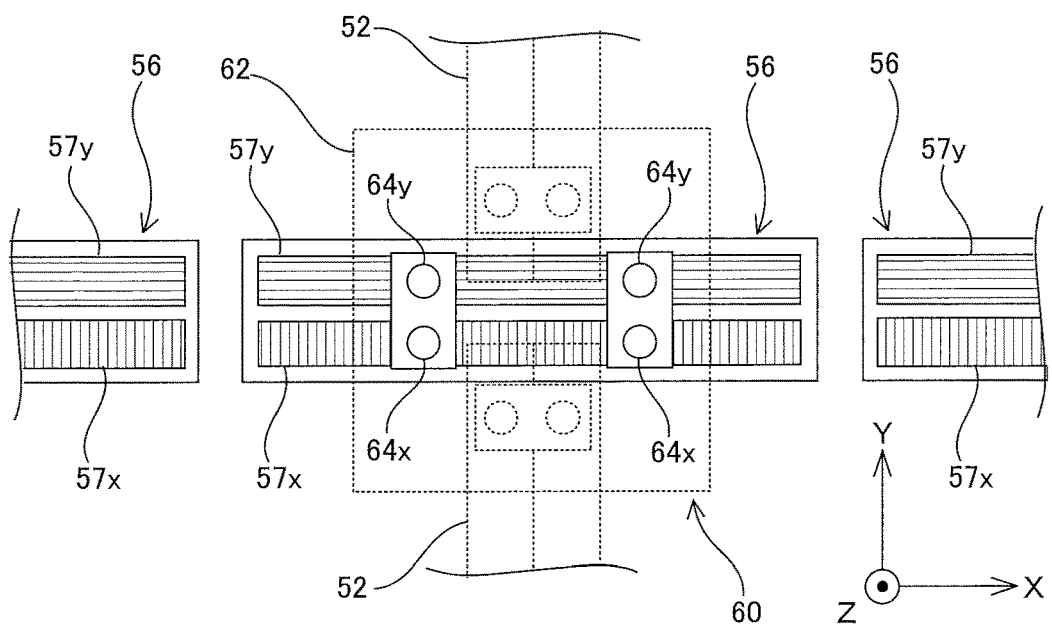

As illustrated in FIG. 5B, an X scale 57*x* is formed in an area on one side in a width direction (on the −Y side in FIG. 5B) on the lower surface of scale 56. Further, a Y scale 57*y* is formed in an area on the other side in the width direction (on the +Y side in FIG. 5B) on the lower surface of scale 56. Since the configurations of X scale 57*x* and Y scale 57*y* are the same as the configurations of X scale 47*x* and Y scale 47*y* (see FIG. 2B for each of them), respectively, formed on scale 46 of mask encoder system 48 described above (see FIG. 2A for each of them), the description thereof will be omitted.

Referring back to FIG. 4C, as is described above (see FIGS. 4A and 4B), for example, two head units 60 are substantially entirely (or partly) housed in substrate holder 34. For example, the two head units 60 are substantially the same except that they are laterally symmetrically disposed on the page surface of FIG. 4C, and therefore one of the head units (on the +X side) will be described below. As can be seen from FIGS. 5A and 5B, head unit 60 is equipped with a Y slide table 62, a pair of X heads 64*x* and a pair of Y heads 64*y* (see FIG. 5B for each of them), and a pair of X heads 66*x* and a pair of Y heads 66*y* (see FIG. 5A for each of them).

Y slide table 62 is made up of a plate-like member with a rectangular shape in planar view, and is attached to substrate holder 34 (see FIG. 4C) via, for example, a mechanical Y linear guide device (not illustrated).

Each of X heads 64*x*, Y heads 64*y* (see FIG. 5B), X heads 66*x* and Y heads 66*y* (see FIG. 5A) is an encoder head of a so-called interference method, which is similar to X heads 49*x* and Y heads 49*y* that mark encoder system 48 described above has (see FIG. 2B for each of them), and is fixed to Y slide table 62. Here, in head unit 60, the pair of Y heads 64*y*, the pair of X heads 64*x*, the pair of Y heads 66*y* and the pair of X heads 66*x* are each fixed to Y slide table 62 so that a distance between the pair of Y heads 64*y*, a distance between the pair of X heads 64*x*, a distance between the pair of Y heads 66*y* and a distance between the pair of X heads 66*x* are prevented from changing due to, for example, vibration or the like. Also, Y slide table 62 itself is formed of a material with a thermal expansion coefficient lower than that of scales 52 and 56 (or equal to that of scales 52 and 56) so that the distances between the pair of Y heads 64*y*, between the pair of X heads 64*x*, between the pair of Y heads 66*y* and between the pair of X heads 66*x* are prevented from changing due to, for example, a change in temperature.

Figure 6:
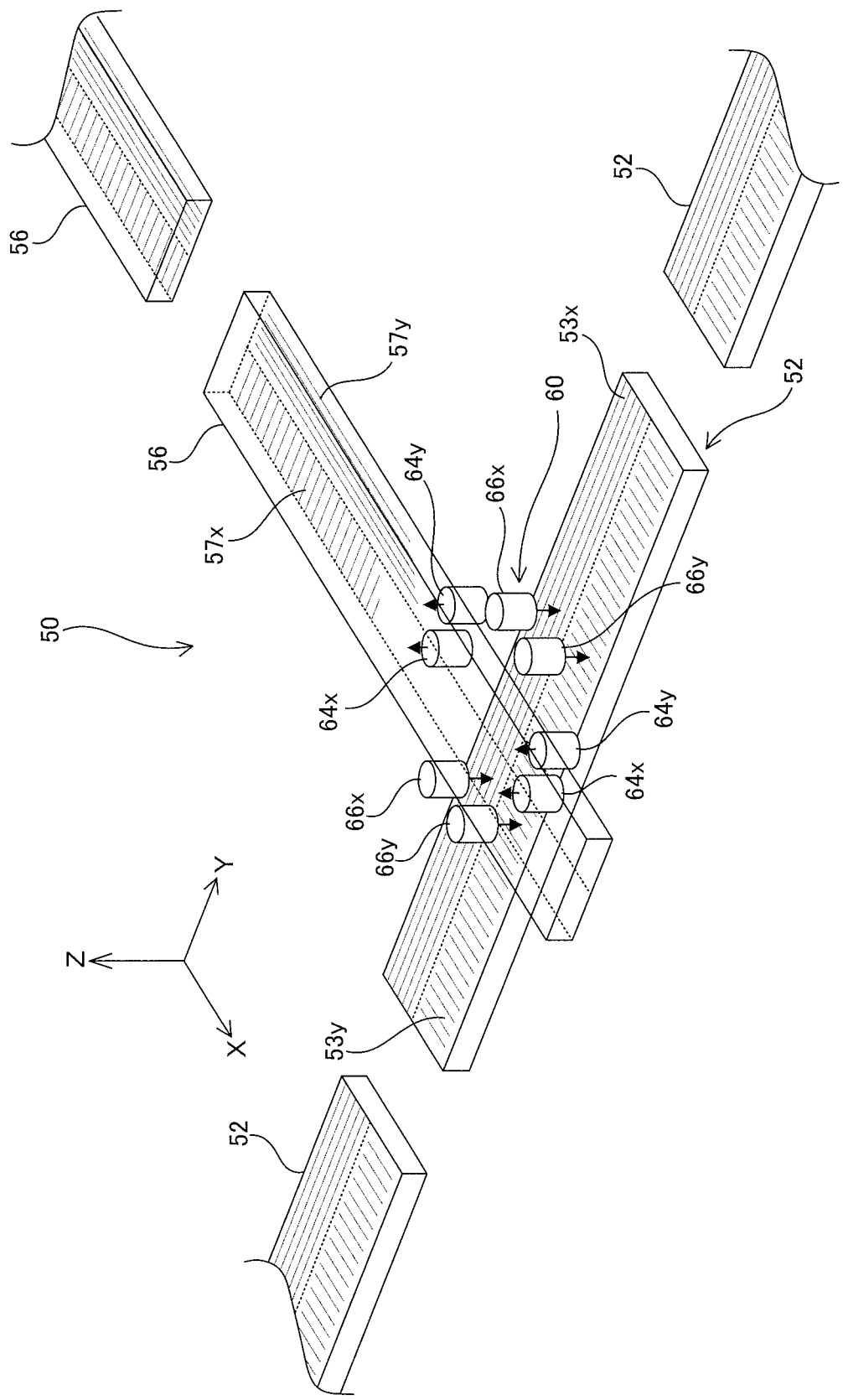
FIG. 6 is a concept view of the substrate encoder system.

As illustrated in FIG. 6, the pair of X heads 64*x* (the upward heads) respectively irradiate two places (two points) spaced apart from each other in the X-axis direction on X scale 57*x* with measurement beams, and the pair of Y heads 64*y* (the upward heads) respectively irradiate two places (two points) spaced apart from each other in the X-axis direction on Y scale 57*y* with measurement beams. In substrate encoder system 50, X heads 64*x* and Y heads 64*y* described above receive the beams from the corresponding scales, thereby supplying displacement amount information of Y slide table 62 (not illustrated in FIG. 6, see FIGS. 4 and 5) to main controller 90 (see FIG. 7).

That is, in substrate encoder system 50, for example, four (two by two) X heads 64*x* and X scales 57*x* (which differ depending on the X-position of Y slide tables 62) that face the X heads 64*x* configure, for example, four X linear encoders 94*x* (see FIG. 7) for obtaining the position information in the X-axis direction of each of a pair of Y slide tables 62 (i.e. the pair of head units 60 (see FIG. 4C)) relative to projection optical system 16 (see FIG. 1), and, for example, four (two by two) Y heads 64*y* and Y scales 57*y* (which differ depending on the X-position of Y slide tables 62) that face the Y heads 64*y* configure, for example, four Y linear encoders 94*y* (see FIG. 7) for obtaining the position information in the Y-axis direction of each of the pair of Y slide tables 62 relative to projection optical system 16.

As illustrated in FIG. 7, main controller 90 obtains the position information of each of the pair of head units 60 (see FIG. 4C) in the X-axis direction and the Y-axis direction with, for example, a resolution of 10 nm or less, on the basis of the outputs of, for example, the four X linear encoders 94*x* and, for example, the four Y linear encoders 94*y*. Further, on the basis of the outputs of, for example, the two X linear encoders 94*x* (or for example, the two Y linear encoders 94*y*) corresponding to one head unit 60, main controller 90 obtains the θz position information (the rotation amount information) of that head unit 60. On the basis of the position information of each of the pair of head units 60 within the XY plane, main controller 90 controls the position of head units 60 within the XY plane using actuator for head unit driving 68 (see FIG. 7).

Further, as illustrated in FIG. 4C, for example, four scales 56 are disposed at a predetermined spacing in the X-axis direction in each of an area on the +X side and an area on the −X side of projection optical system 16. And, similarly to mask encoder system 48 described above, a spacing between the pair of X heads 64*x* and a spacing between the pair of Y heads 64*y* that one head unit 60 has are set wider than a spacing between scales 56 adjacent to each other, as illustrated in FIG. 5B. Accordingly, in substrate encoder system 50, at least one of the pair of X heads 64*x* constantly faces X scale 57*x*, and at least one of the pair of Y heads 64*y* constantly faces Y scale 57*y*. Consequently, substrate encoder system 50 can obtain the position information of Y slide table 62 without interrupting the measurement values. Therefore, also in this case, the linkage processing of the head outputs, similar to the linkage processing of the head outputs in mask encoder system 48 (see FIGS. 3A to 3E) described above, is performed.

Further, as illustrated in FIG. 6, the pair of X heads 66*x* (the downward heads) irradiate two places (two points) spaced apart from each other in the Y-axis direction on X scale 53*x* with measurement beams, respectively, and the pair of Y heads 66*y* (the downward heads) irradiate two places (two points) spaced apart from each other in the Y-axis direction on Y scale 53y with measurement beams, respectively. In substrate encoder system 50, X heads 66x and Y heads 66y described above receive the beams from the corresponding scales, thereby supplying the relative displacement amount information between head unit 60 and substrate holder 34 (not illustrated in FIG. 6, see FIG. 1) to main controller 90 (see FIG. 7).

That is, in substrate encoder system 50, for example, four (two by two) X heads 66x and X scales 53x (which differ depending on the Y-position of substrate holder 34) that face the X heads 66x configure, for example, four X linear encoders 96x (not illustrated in FIG. 6, see FIG. 7) for obtaining the position information in the X-axis direction of each of the pair of head units 60 relative to substrate holder 34, and, for example, four (two by two) Y heads 66y and Y scales 53y (which differ depending on the Y-position of substrate holder 34) that face the Y heads 66y configure, for example, four Y linear encoders 96y (not illustrated in FIG. 6, see FIG. 7) for obtaining the position information in the Y-axis direction of each of the pair of head units 60 relative to substrate holder 34.

As illustrated in FIG. 7, main controller 90 obtains the position information of substrate holder 34 (see FIG. 1) relative to apparatus main body 18 (see FIG. 1) in the X-axis direction and the Y-axis direction with a resolution of, for example, 10 nm or less, on the basis of the outputs of, for example, the four X linear encoders 94x and, for example, of the four Y linear encoders 94y, and the outputs of the four X linear encoders 96x described above and, for example, the four Y linear encoders 96y, i.e., on the basis of the computation result of the position information of each of the pair of head units 60 relative to projection optical system 16 (see FIG. 1) within the XY plane and the position information of each of the pair of head units 60 relative to substrate holder 34 within the XY plane. Further, main controller 90 obtains the relative position information (rotation amount information) in the θz direction between head units 60 and substrate holder 34, on the basis of the outputs of at least two of, for example, the four X linear encoders 94x (or, for example, the four Y linear encoders 94y). Main controller 90 controls the position of substrate holder 34 within the XY plane using substrate driving system 93, on the basis of the position information of substrate holder 34 within the XY plane obtained from the measurement value of substrate encoder system 50 described above.

Further, as illustrated in FIG. 4C, on substrate holder 34, for example, four scales 52 are disposed at predetermined spacing in each of an area on the +X side and an area on the −X side of substrate P, as described above. And, similarly to mask encoder system 48 described above, a spacing between the pair of X heads 66x and a spacing between the pair of Y heads 66y that one head unit 60 has are set wider than a spacing between scales 52 adjacent to each other, as illustrated in FIG. 5A. Accordingly, in substrate encoder system 50, at least one of the pair of X heads 66x constantly faces X scale 53x and also at least one of the pair of Y heads 66y constantly faces Y scale 53y. Consequently, in substrate encoder system 50, the relative position information between head units 60 and substrate holder 34 (see FIG. 4C) can be obtained without interrupting the measurement values. Therefore, also in this case, the linkage processing of the head outputs, similar to the linkage processing of the head outputs in mask encoder system 48 (see FIGS. 3A to 3E) described above, is performed.

In FIG. 7, a block diagram is illustrated that shows the input/output relationship of main controller 90 that centrally configures the control system of liquid crystal exposure apparatus 10 (see FIG. 1) and performs the overall control of the respective constituents. Main controller 90 includes a workstation (or a microcomputer) and the like, and performs the overall control of the respective constituents of liquid crystal exposure apparatus 10.

In liquid crystal exposure apparatus 10 (see FIG. 1) configured as described above, under the control of main controller 90 (see FIG. 7), mask M is loaded onto mask stage device 14 by a mask loader (not illustrated) and also substrate P is loaded onto substrate stage device 20 (substrate holder 34) by a substrate loader (not illustrated). After that, main controller 90 implements alignment measurement using an alignment detection system (not illustrated), and after the alignment measurement is finished, the exposure operations of a step-and-scan method are sequentially performed with respect to a plurality of shot areas set on substrate P.

Next, an example of operations of mask stage device 14 and substrate stage device 20 at the time of exposure operation will be described using FIGS. 8A to 15B. Note that, although the case where four shot areas are set on one substrate P (the so-called case of preparing four areas) will be described in the explanation below, the number and the arrangement of the shot areas set on one substrate P can be changed as needed.

Figure 8A:
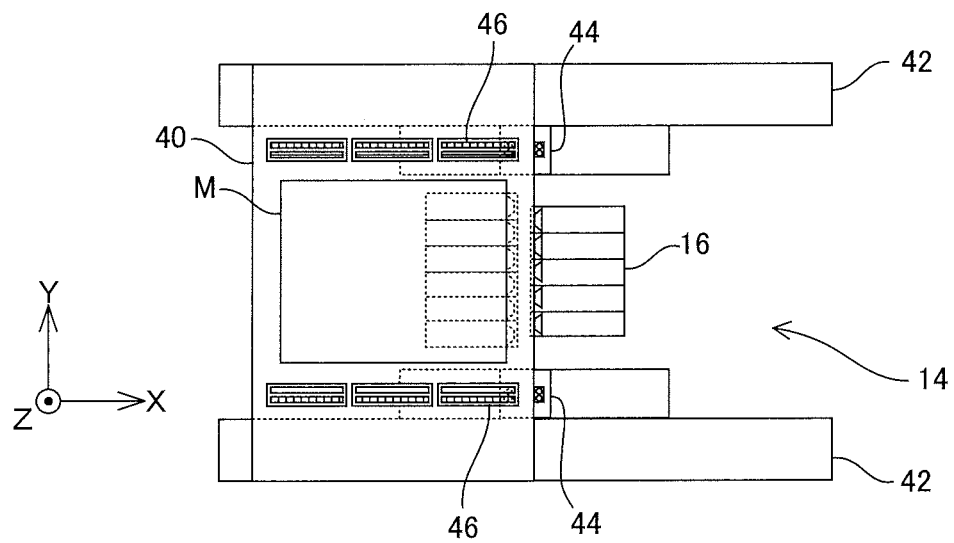
FIG. 8A is a view (No. 1) showing an operation of the mask encoder system at the time of exposure operation.
Figure 8B:
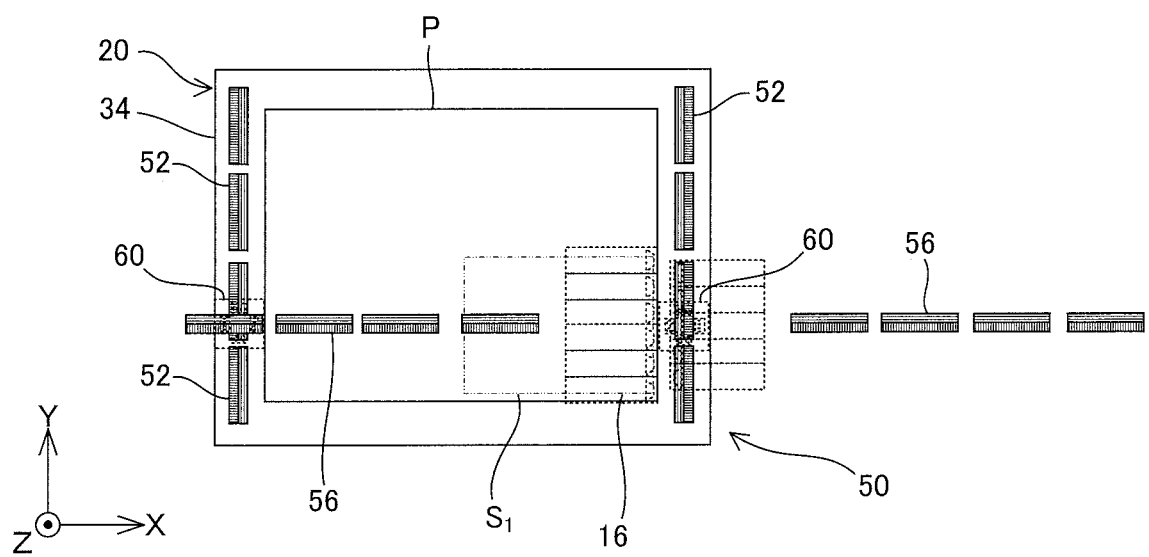
FIG. 8B is a view (No. 1) showing an operation of the substrate encoder system at the time of exposure operation.

Mask stage device 14 after an alignment operation has been completed is illustrated in FIG. 8A, and substrate stage device 20 after an alignment operation has been completed is illustrated in FIG. 8B (however, other members than substrate holder 34 are not illustrated, the same applies hereinafter). As an example, as illustrated in FIG. 8B, the exposure processing is performed from a first shot area $S_1$ set on the −Y side on the +X side of substrate P. In mask stage device 14, as illustrated in FIG. 8A, the positioning of mask M is performed on the basis of the output of mask encoder system 48 (see FIG. 7) so that the +X side end of mask M is slightly on the further −X side than the illumination area irradiated with illumination light IL from illumination system 12 (see FIG. 1 for each of them) (however, in the state illustrated in FIG. 8A, illumination light IL has not yet been irradiated on mask M).

Specifically, for example, the +X side end of a pattern area of mask M is located on the −X side with respect to the illumination area, by a run-up distance necessary for performing scanning exposure at a predetermined velocity (i.e., an acceleration distance necessary for attaining the predetermined velocity), and scales 46 are provided so that the position of mask M can be measured by mask encoder system 48 in such a location. Main controller 90 (see FIG. 7) also performs the position control of mask holder 40 in a range where at least three heads (at least three of the four heads 49x and the four heads 49y) do not move off from scales 46 (do not move out of a measurable range).

Further, in substrate stage device 20, as illustrated in FIG. 8B, the positioning of substrate P is performed on the basis of the output of substrate encoder system 50 (see FIG. 7) so that the +X side end of the first shot area $S_1$ is slightly on the further −X side than the exposure area irradiated with illumination light IL from projection optical system 16 (see FIG. 1) (however, in the state illustrated in FIG. 8B, illumination light IL has not yet been irradiated on substrate P). Specifically, for example, the +X side end of the first shot area $S_1$ of substrate P is located on the −X side with respect to the exposure area, by a run-up distance necessary for performing scanning exposure at a predetermined velocity (i.e., an acceleration distance necessary for attaining the predetermined velocity), and scales 52 are provided so that the position of substrate P can be measured by substrate encoder system 50 in such a location. Main controller 90 (see FIG. 7) also performs the position control of substrate holder 34 in a range where at least three heads (at least three of the four heads 64x and the four heads 64y) do not move off from scales 56 (do not move out of a measurable range). Note that, in FIG. 8B, head unit 60 on the +X side does not face scales 56, but the position within the XY plane of head unit 60 on the +X side can be controlled by driving head unit 60 on the +X side synchronously with head unit 60 on the −X side. Note that scale(s) 56 may be additionally provided so that the pair of head units 60 never move off from scales 56.

Note that, also on the side where mask M and substrate P are each decelerated after the scanning exposure of the shot area is finished, similarly, scales 46 and 56 are provided so that the positions of mask M and substrate P can be measured by mask encoder system 48 and substrate encoder system 50, respectively, until mask M and substrate P are further moved by a deceleration distance necessary for decelerating mask M and substrate P from the velocity at the time of scanning exposure to a predetermined velocity. Alternatively, in at least one of the operation during acceleration and the operation during deceleration, the positions of mask M and substrate P may each be measured by another measurement system that is different from mask encoder system 48 and substrate encoder system 50.

Figure 9A:
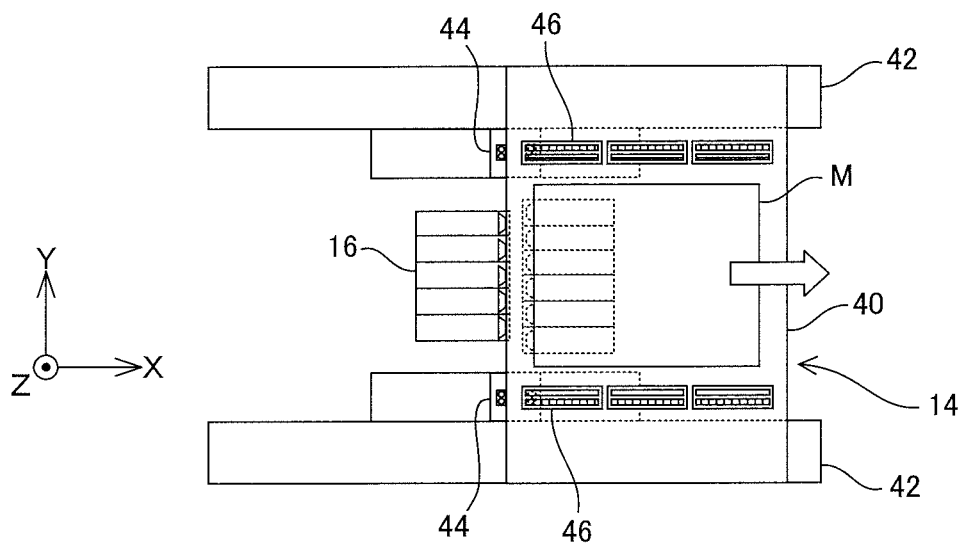
FIG. 9A is a view (No. 2) showing an operation of the mask encoder system at the time of exposure operation.
Figure 9B:
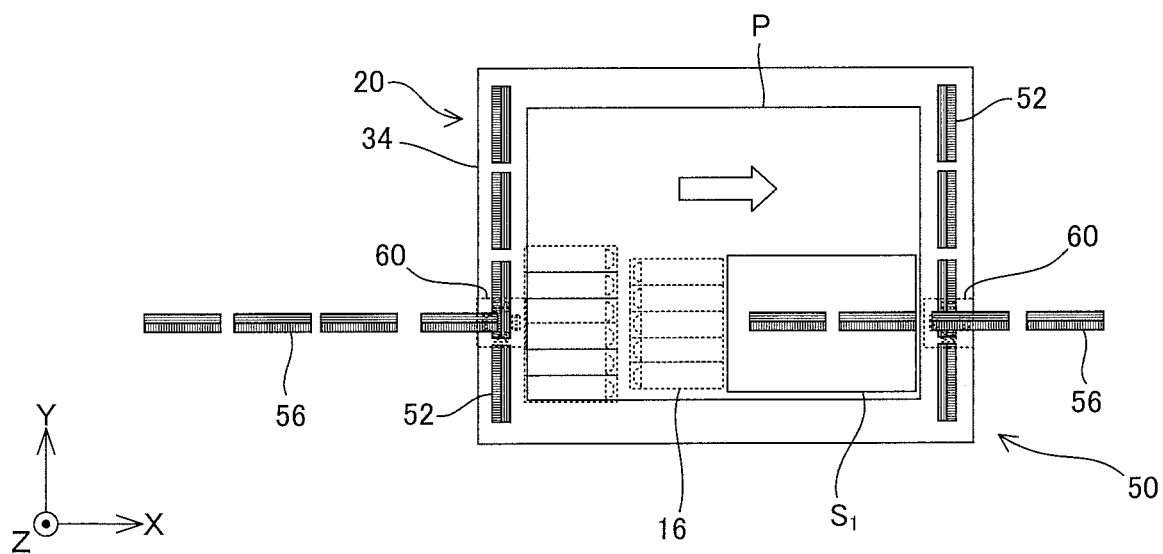
FIG. 9B is a view (No. 2) showing an operation of the substrate encoder system at the time of exposure operation.

Subsequently, mask holder 40 is driven (accelerated, driven at a constant speed, and decelerated) to the +X direction, as illustrated in FIG. 9A, and synchronously with mask holder 40, substrate holder 34 is also driven (accelerated, driven at a constant speed, and decelerated) to the +X direction, as illustrated in FIG. 9B. When mask holder 40 is driven, main controller 90 (see FIG. 7) performs position control of mask M on the basis of the output of mask encoder system 48 (see FIG. 7), and also performs position control of substrate P on the basis of the output of substrate encoder system 50 (see FIG. 7).

When substrate holder 34 is driven in the X-axis direction, the pair of head units 60 are not relatively moved with respect to substrate holder 34 (are in a static state with respect to substrate holder 34), but are moved integrally with substrate holder 34 in the X-axis direction. That is, the position control related to the scan direction of substrate holder 34 (substrate P) and the pair of head units 60 (a plurality of heads 64x, 64y, 66x and 66y) is performed by a common drive system (substrate driving system 93) (see FIG. 7)). While mask holder 40 and substrate holder 34 are driven at a constant speed in the X-axis direction, substrate P is irradiated with illumination light IL that has passed through mask M and projection optical system 16 (see FIG. 1 for each of them), and thereby a mask pattern that mask M has is transferred onto shot area $S_1$. On this occasion, since head unit 60 on the +X side that moved off from scales 56 comes to face scales 56, the linkage processing described above should be performed between the pair of head units 60.

Figure 10A:
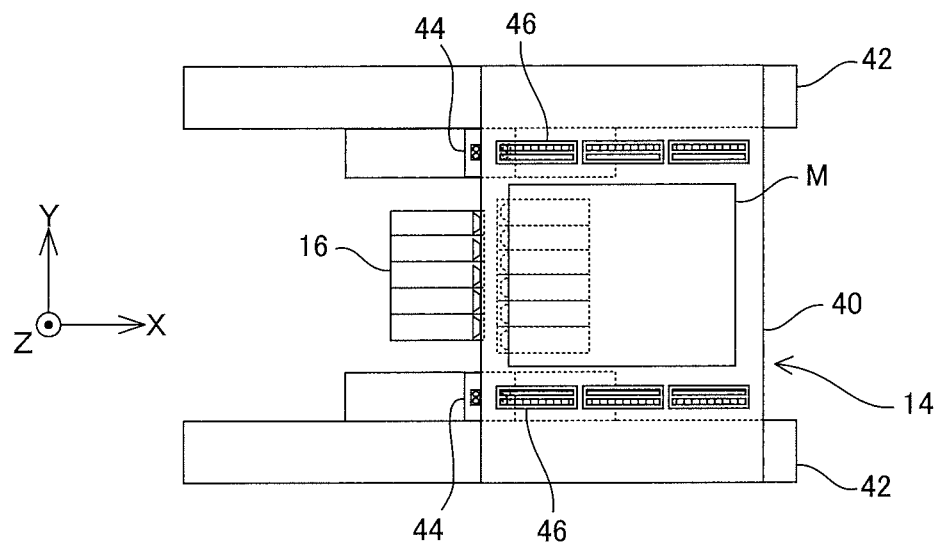
FIG. 10A is a view (No. 3) showing an operation of the mask encoder system at the time of exposure operation.
Figure 10B:
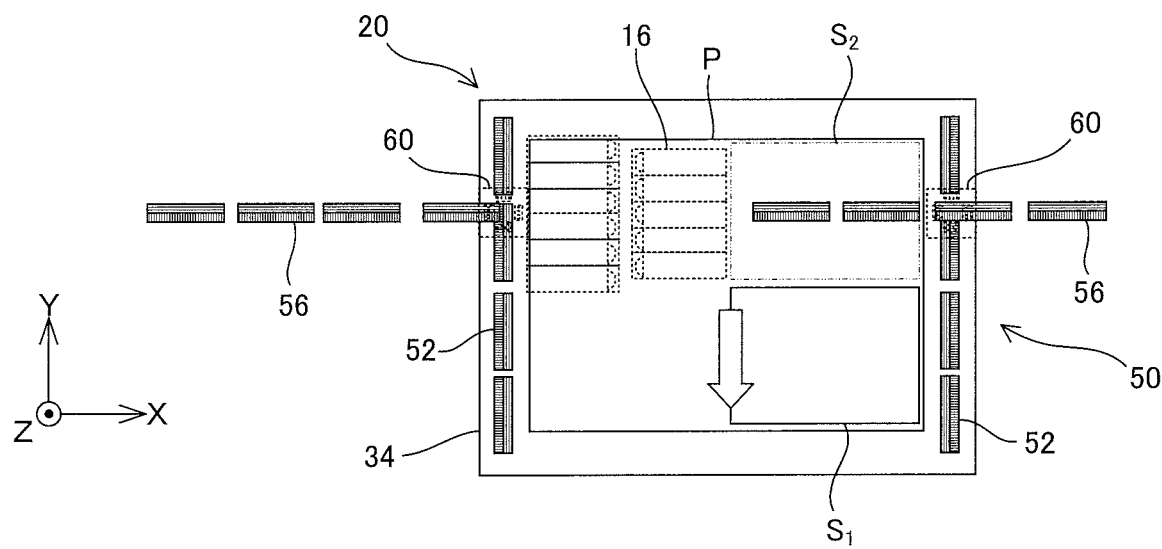
FIG. 10B is a view (No. 3) showing an operation of the substrate encoder system at the time of exposure operation.

When the transfer of the mask pattern onto the first shot area $S_1$ on substrate P has been completed, in substrate stage device 20, as illustrated in FIG. 10B, substrate holder 34 is driven to the −Y direction (Y-step) by a predetermined distance (a distance that is substantially a half of a width direction size of substrate P) on the basis of the output of substrate encoder system 50 (see FIG. 7), for the exposure operation to a second shot area $S_2$ set on the +Y side of the first shot area $S_1$. At the time of the Y-step operation of substrate holder 34 described above, mask holder 40 is, as illustrated in FIG. 10A, static in a state where the −X side end of mask M is located on the slightly further +X side than the illumination area (however, in the state shown in FIG. 10A, mask M is not illuminated).

Further, in substrate stage device 20, in parallel with the step operation of substrate holder 34 to the −Y direction described above, the pair of head units 60 are driven relative to substrate holder 34 to the +Y direction (i.e., a direction opposite to substrate holder 34) by a distance that is the same as a distance along which substrate holder 34 is driven, on the basis of the output of Y linear encoder 96y (see FIG. 7). In this case, visually, head units 60 are not moved in the Y-axis direction relative to projection optical system 16. Consequently, the facing state between head units 60 and scales 56 is maintained.

After that, although not illustrated, when the Y-step operation of substrate holder 34 has been completed, mask holder 40 is driven to the −X direction on the basis of the output of mask encoder system 48 (see FIG. 7), and synchronously with mask holder 40, substrate holder 34 is driven to the −X direction on the basis of the output of substrate encoder system 50 (see FIG. 7). Accordingly, the mask pattern is transferred onto the second shot area $S_2$. Also on this occasion, for example, four head units 60 are in a static state. After that, the scan operation of mask holder 40, the Y-step operation of substrate holder 34 and the scan operation of substrate holder 34 described above are repeated as needed, and thereby the mask pattern is sequentially transferred onto the plurality of shot areas on substrate P.

At the time of the exposure operation described above, whenever the stepping of substrate holder 34 to the +Y direction and the −Y direction is performed, the pair of head units 60 are driven by the same distance in a direction opposite to substrate holder 34 so that the facing state with scales 56 is maintained.

Figure 16:
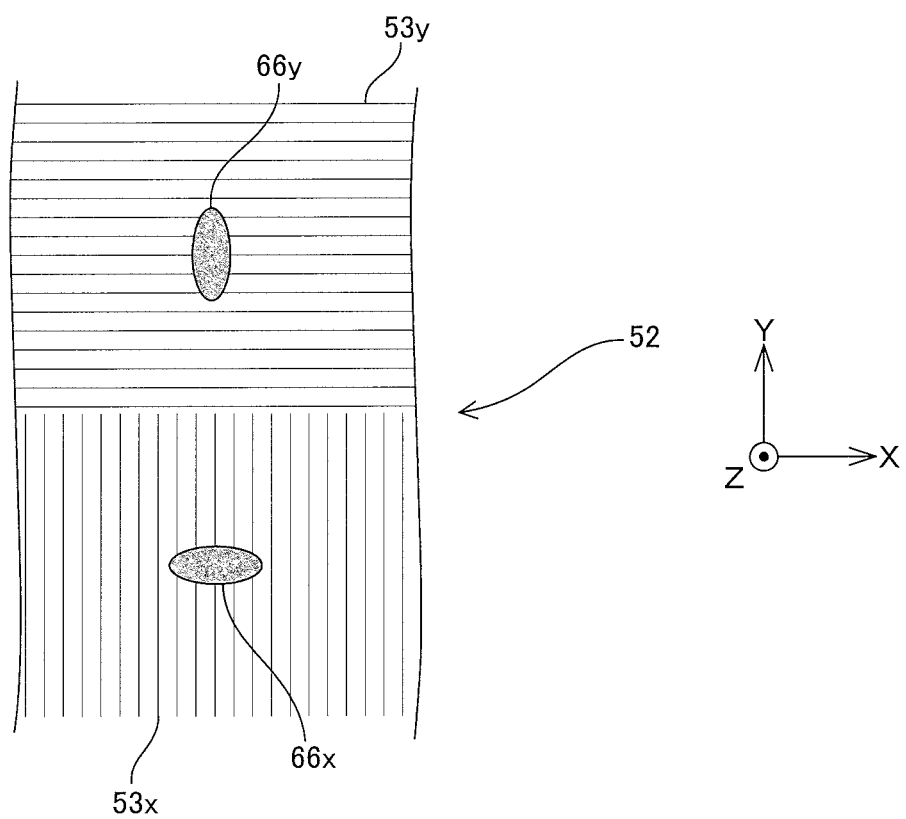
FIG. 16 is a view showing irradiation points of measurement beams on an encoder scale.

Here, as is described above, Y scale 53y has a plurality of grid lines extending in the X-axis direction. Further, as illustrated in FIG. 16, an irradiation point 66y (to be described using the same reference sign as the Y head for the sake of convenience) of the measurement beam irradiated from Y head 66y onto Y scale 53y has an oval shape with the Y-axis direction serving as a long axis direction. In Y linear encoder 96y (see FIG. 7), when Y head 66y and Y scale 53y are relatively moved in the Y-axis direction and the measurement beam crosses the grid lines, the output from Y head 66y is changed on the basis of the phase change of the ±first-order diffraction beams from the irradiation point.

In order to cope therewith, when driving substrate holder 34 in the scan direction (the X-axis direction) during the scan exposure operation described above, main controller 90 (see FIG. 7) controls the positions in the stepping direction (the Y-position) of head units 60 so that Y head 66y that head unit 60 (see FIG. 4B) has does not cross a plurality of grid lines that form Y scale 53y, i.e., so that the output from Y head 66y is not changed (the change is zero).

Specifically, for example, the Y-position of Y head 66y is measured by a sensor with a resolution higher than the pitch between the grid lines that configure Y scale 53y, and immediately before the irradiation point of the measurement beam from the Y head 66y is about to cross the grid lines (the output of Y head 66y is about to be changed), the Y-position of Y head 66y is controlled via actuator for head unit driving 68 (see FIG. 7). Note that this is not intended to be limiting, and, for example, in the case where the output of Y head 66y is changed by the measurement beam from Y head 66y crossing the grid lines, the drive control of Y head 66y may be performed in response, thereby substantially preventing the output from Y head 66y from being changed. In this case, the sensor to measure the Y-position of Y head 66y is unnecessary.

When the transfer of the mask patterns onto the first shot areas $S_1$ to a fourth shot area $S_4$ on substrate P has been completed in the procedures described so far, the exchange of substrate P is performed at a predetermined substrate exchange position. Here, in general, the substrate exchange position is set in a location spaced apart from an area directly under projection optical system 16 so that the substrate exchange is not blocked by projection optical system 16, and therefore, when substrate holder 34 is moved to the substrate exchange position, there is a risk that X heads 64x and Y heads 64y attached to head unit 60 move off from (come into a non-facing state with) scales 56 fixed to apparatus main body and the output of substrate encoder system 50 is discontinued. As the measures to be taken in such a case, it is considered that a scale (a mark) for the substrate exchange time is provided at apparatus main body 18.

As is described above, according to liquid crystal exposure apparatus 10 related to the present embodiment, in each of mask encoder system 48 for obtaining the position information of mask M within the XY plane and substrate encoder system 50 for obtaining the position information of substrate P within the XY plane (see FIG. 1 for each of them), the optical path lengths of the measurement beams irradiated to the corresponding scales are short, and therefore, the influence of air fluctuation can be reduced, for example, compared with a conventional interferometer system. Consequently, the positioning accuracy of mask M and substrate P is improved. Further, since the influence of air fluctuation is small, a partial air conditioning equipment that is essential in the case of using the conventional interferometer system can be omitted, which allows the cost to be reduced.

Moreover, in the case of using interferometer systems, a large and heavy bar mirror needs to be equipped in mask stage device 14 and substrate stage device 20. However, since such a bar mirror is unnecessary in mask encoder system 48 and substrate encoder system 50 related to the present embodiment, a system including mask holder 40 and a system including substrate holder 34 are each downsized and lightened and also the better weight balance is obtained, and accordingly the position controllability of mask M and substrate P is improved. In addition, the points to be adjusted can be decreased, compared with the case of using the interferometer systems, which leads to the cost reduction of mask stage device 14 and substrate stage device 20 and further leads to the improved maintainability. Furthermore, the adjustment at the time of assembly becomes easier (or unnecessary).

Further, in substrate encoder system 50 related to the present embodiment, since the facing state between head units 60 and scales 56 is maintained by driving the pair of head units 60 in a direction opposite to substrate P along the Y-axis direction, a plurality of encoder heads need not be disposed along the Y-axis direction on substrate holder 34 (or scales 56 on the apparatus main body 18 side need not be formed with a broad width). Consequently, the configuration of the substrate position measurement system can be simple, which allows the cost to be reduced.

Further, in mask encoder system 48 related to the present embodiment, since a configuration is employed in which the position information of mask holder 40 within the XY plane is obtained while switching, as needed, the outputs of a pair of encoder heads (X heads 49x, Y heads 49y) adjacent to each other depending on the X-position of mask holder 40, the position information of mask holder 40 can be obtained without interruption even if the plurality of scales 46 are disposed at a predetermined spacing (spaced apart from each other) in the X-axis direction. Consequently, a scale with a length equivalent to the movement stroke of mask holder 40 (a length about three times of that of scale 46 in the present embodiment) needs not be prepared, which allows the cost to be reduced, and thus, mask encoder system 48 is especially suitable for liquid crystal exposure apparatus 10 using mask M with a large size as in the present embodiment. Similarly in substrate encoder system 50 related to the present embodiment, the plurality of scales 52 are disposed in the Y-axis direction and the plurality of scales 56 are disposed in the X-axis direction, each at a predetermined spacing, and therefore, a scale with a length equivalent to the movement stroke of substrate P needs not be prepared, and thus, substrate encoder system 50 is especially suitable for liquid crystal exposure apparatus 10 using substrate P with a large size.

Second Embodiment

Next, a liquid crystal exposure apparatus related to a second embodiment will be described using FIGS. 11A to 11C. The configuration of the liquid crystal exposure apparatus related to the second embodiment is the same as that in the first embodiment described above except that the configuration of a substrate encoder system 150 is different. Therefore, only the differences will be described below, and elements that have the same configurations and functions as those in the first embodiment described above will be provided with the same reference signs as those in the first embodiment described above, and the description thereof will be omitted.

In the first embodiment described above, a configuration is employed in which the step movement of the pair of head units 60, that substrate stage device 20 (substrate holder 34) has, in a direction opposite to substrate P is performed at the time the Y-step operation of substrate P, and the pair of head units 60 are moved integrally with substrate P in the scan direction, whereas in the present second embodiment, a configuration is employed in which the Y-step operation of the pair of head units 60 integrally with substrate P is performed at the time of the Y-step operation of substrate P and the pair of head units 60 are moved with a long stroke in a direction opposite to substrate P at the time of the scan exposure operation of substrate P, which is reverse to the first embodiment described above. Consequently, the arrangement, in which head units 60, scales 52 and scales 56 and the like that configure substrate encoder system 50 are rotated around the Z-axis, for example, at an angle of 90 degrees with respect to the first embodiment described above, is employed.

Figure 11A:
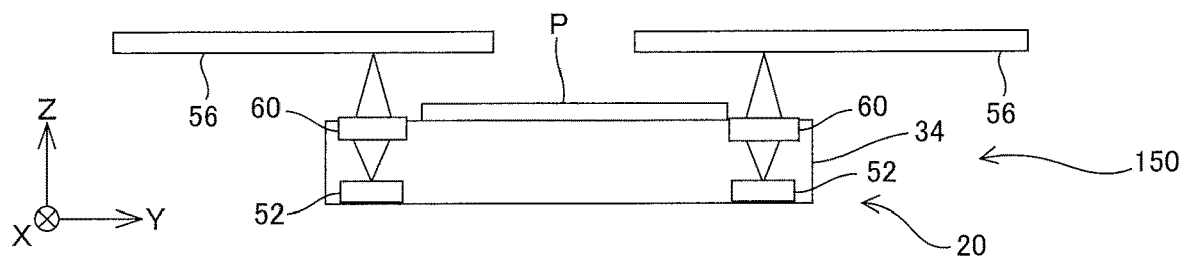
FIGS. 11A and 11B are concept views (a side view and a plan view, respectively) of a substrate encoder system related to a second embodiment.
Figure 11B:
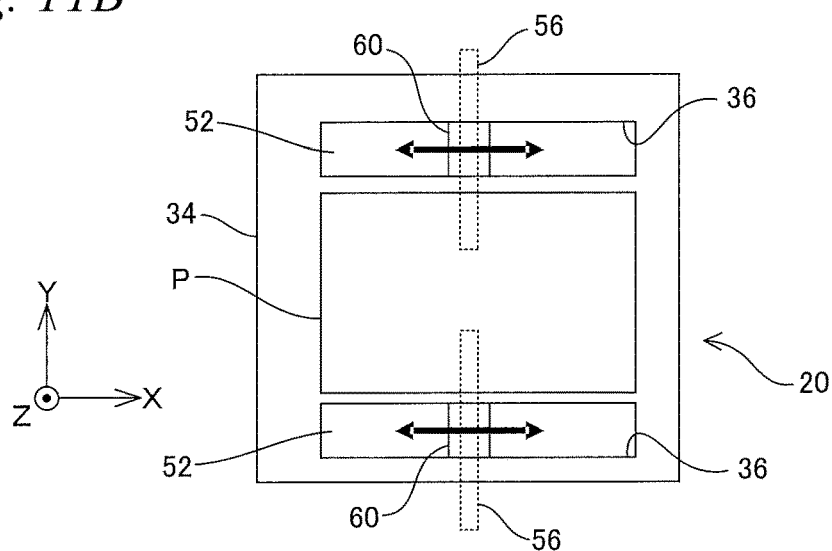

In FIGS. 11A and 11B, the concept views of substrate encoder system 150 of the second embodiment are shown. Recessed sections 36 formed at substrate holder 34 extend in the X-axis direction, and on the bottom surfaces of the recessed sections, scales 52 extending in the X-axis direction are fixed. Similarly to the first embodiment described above, head units 60 are disposed in recessed sections 36, and are movable with a predetermined long stroke relative to substrate holder 34 in the X-axis direction. Further, scales 56 extending in the Y-axis direction are fixed to apparatus main body 18 (see FIG. 1), on the +Y side and the −Y side of projection optical system 16 (see FIG. 11C).

Figure 11C:
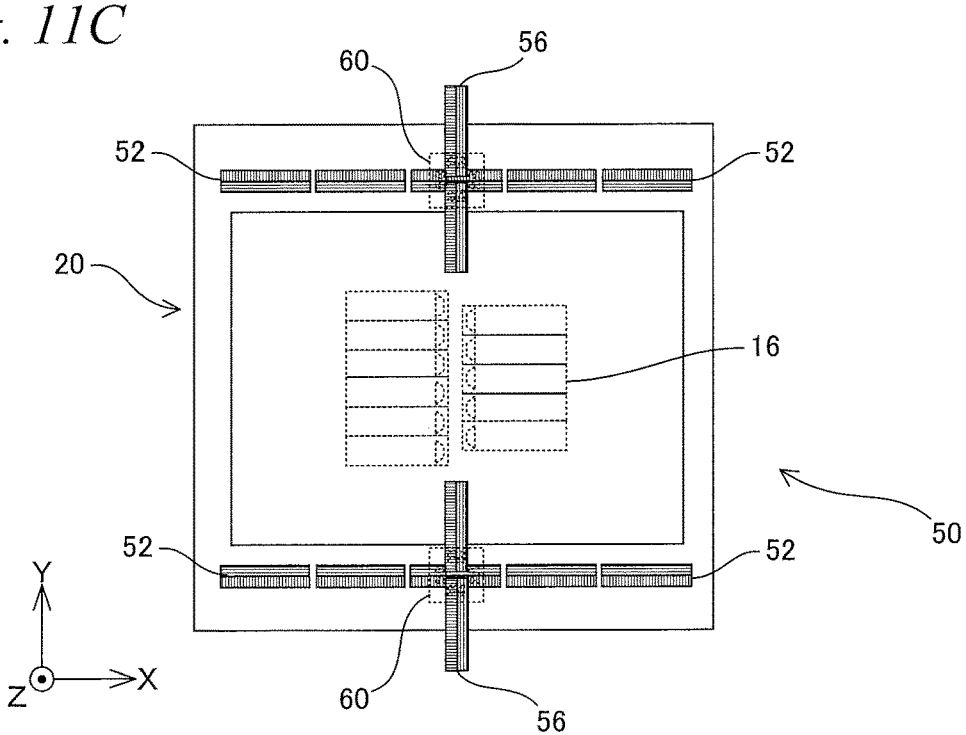
FIG. 11C is a view showing a specific example of the substrate encoder system.

As illustrated more specifically in FIG. 11C, in each of an area on the +Y side and an area on the −Y side of substrate holder 34, for example, five scales 52 are disposed at a predetermined spacing in the X-axis direction, and in each of an area on the +Y side and an area on the −Y side of projection optical system 16, on the lower surface of apparatus main body 18 (see FIG. 1), for example, two scales 56 are disposed at a predetermined spacing. Since the second embodiment is similar to the first embodiment described above in that X scales 53x and Y scales 53y (see FIG. 6) are formed on scales 52, and X scales 57x and Y scales 57y (see FIG. 6) are formed on scales 56, and encoder heads (not illustrated) for measuring the relative displacement amount of head units 60 relative to projection optical system 16 or substrate holder 34 are attached to head units 60 using those X scales 53x and 57x and Y scales 53y and 57y, the description thereof will be omitted. The second embodiment is similar to the first embodiment described above also in that the linkage processing is performed between a pair of heads adjacent to each other because a plurality of scales are disposed spaced apart from each other.

In the present second embodiment, at the time of the scan exposure operation of substrate P, the pair of head units 60 are driven along the X-axis direction in a direction opposite to substrate P and yet by the same distance as substrate P so that visually the X-positions of the pair of head units 60 are not changed. That is, head units 60 are relatively moved with respect to substrate P in the X direction. Accordingly, since the pair of head units 60 are prevented from moving off from the corresponding scales 56, the measurement values of substrate encoder system 150 are not interrupted. On the other hand, at the time of the Y-step operation of substrate P, substrate holder 34 and the pair of head units 60 are integrally movable with a long stroke in the Y-axis direction by a common drive system (substrate driving system 93 (see FIG. 7)).

Figure 12:
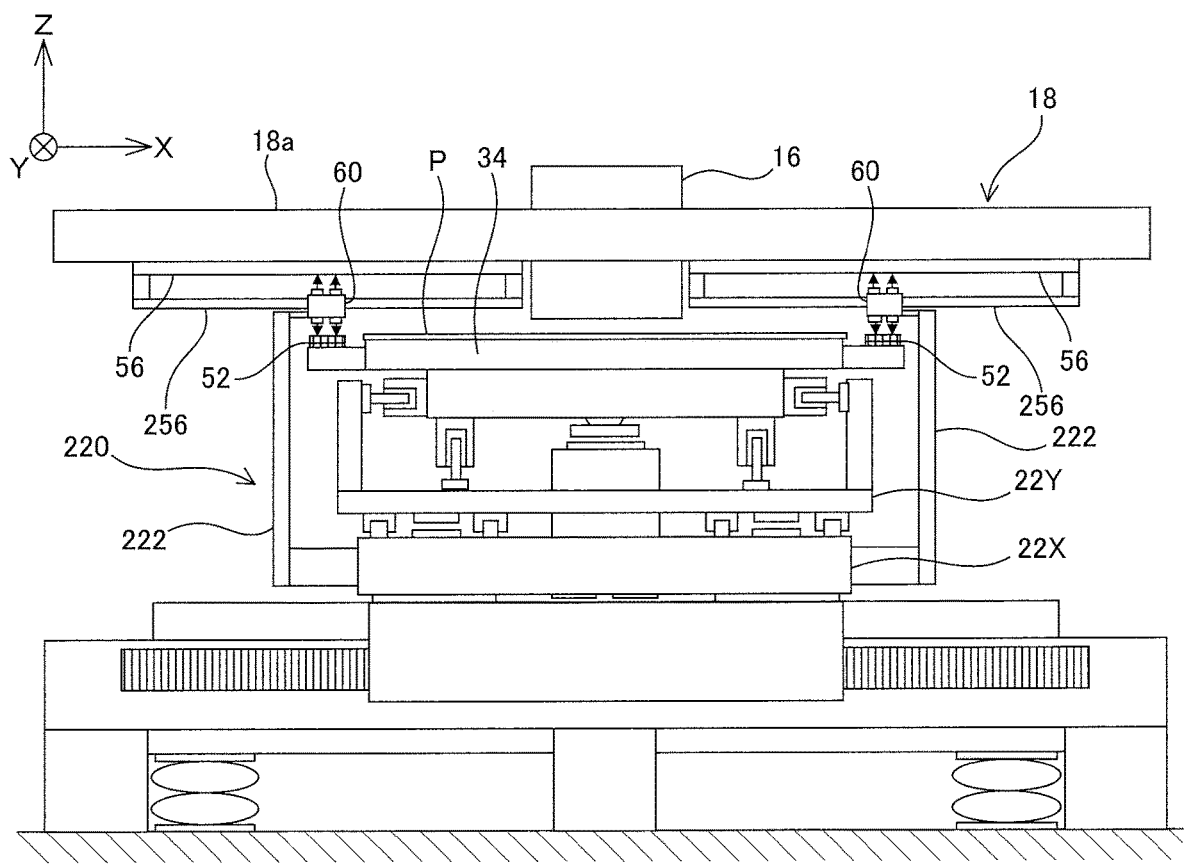
FIG. 12 is a view showing a modified example of the substrate encoder system of the first embodiment.

Note that the configuration of each of the first embodiment and the second embodiment described so far is an example, and can be changed as needed. For example, although the pair of head units 60 are provided at substrate holder 34, and substrate holder 34 also has the actuator for driving head units 60 in the first embodiment described above, this is not intended to be limiting, and for example, as illustrated in FIG. 12, head units 60 may be supported in a suspended manner by upper mount section 18a of apparatus main body 18. In this case, head units 60 are attached to apparatus main body 18 via guide devices 256 that straightly guide head units 60 in the X-axis direction. Further, reversely to the first embodiment described above, a substrate stage device 220 is configured such that Y coarse movement stage 22y is placed on X coarse movement stage 22X. Then, an arm member 222 that is mechanically coupled to each of the pair of head units 60 is connected to X coarse movement stage 22X. Note that, although scales 52 are disposed on the outer side of substrate holder 34 in FIG. 12, scales 52 may be disposed on substrate holder 34 (or in substrate holder 34) similarly to the first embodiment described above.

In the present modified example, when X coarse movement stage 22X (and substrate holder 34) is/are moved with a predetermined long stroke in the X-axis direction at the time of the scan exposure operation, the pair of head units 60 are moved integrally with X coarse movement stage 22X relative to the projection optical system in the X-axis direction, via arm members 222. On this movement, substrate holder 34 and the pair of head units 60 are driven by a common drive system (the X actuator configuring a part of substrate driving system 93 (see FIG. 7)). Further, at the time of the Y-step operation of substrate P, since only Y coarse movement stage 22Y (and substrate holder 34) is/are moved in the Y-axis direction, the positions of head units 60 relative to projection optical system 16 are not changed. In this manner, the operations of head units 60 of the present modified example are the same as those in the first embodiment described above. According to the present modified example, since actuators exclusively used for driving head units 60 are not necessary, the heat generation or the dust generation in the vicinity of substrate P can be suppressed.

Figure 13:
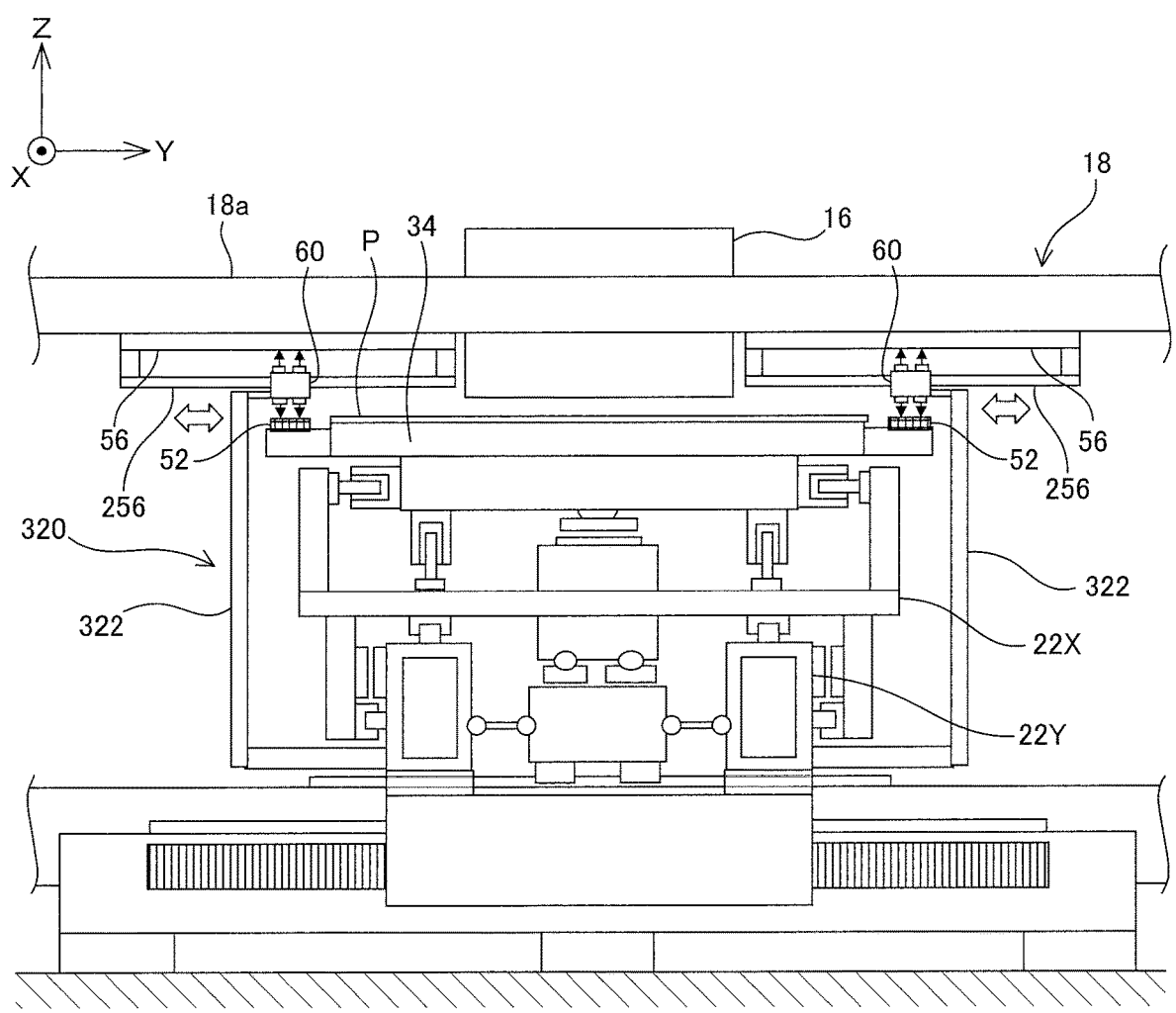
FIG. 13 is a view showing a modified example of the substrate encoder system of the second embodiment.

Further, for example, also in the second embodiment, the pair of head units 60 are provided at substrate holder 34 and substrate holder 34 also has the actuator for driving head units 60, but this is not intended to be limiting, and as illustrated in FIG. 13, head units 60 may be supported in a suspended manner by upper mount section 18a of apparatus main body 18. Similarly to the modified example illustrated in FIG. 12, head units 60 are attached to apparatus main body 18 via guide devices 256. Similarly to the first embodiment, the exemplary embodiment of FIG. 13 provides where in substrate stage device 320, X coarse movement stage 22X is placed on Y coarse movement stage 22Y, and the pair of arm members 322 connected to the pair of head units 60, respectively, are connected to Y coarse movement stage 22Y. Also in the present modified example, scales 52 may be disposed on substrate holder 34 (or in substrate holder 34).

In the present modified example, when Y coarse movement stage 22Y (and substrate holder 34) is/are moved with a predetermined long stroke in the Y-axis direction at the time of the Y-step operation, the pair of head units 60 are moved integrally with Y coarse movement stage 22Y relative to the projection optical system in the Y-axis direction, via arm members 322. On this movement, substrate holder 34 and the pair of head units 60 are driven by a common drive system (the Y actuator configuring a part of substrate driving system 93 (see FIG. 7)). Further, at the time of the scan exposure operation of substrate P, only X coarse movement stage 22X (and substrate holder 34) is/are moved in the X-axis direction, the positions of head units 60 relative to projection optical system 16 are not changed. In this manner, the operations of head units 60 in the present modified example are the same as those in the second embodiment described above. According to the present modified example, since actuators exclusively used for driving head units 60 are not necessary, the heat generation or the dust generation in the vicinity of substrate P can be suppressed.

Figure 14A:
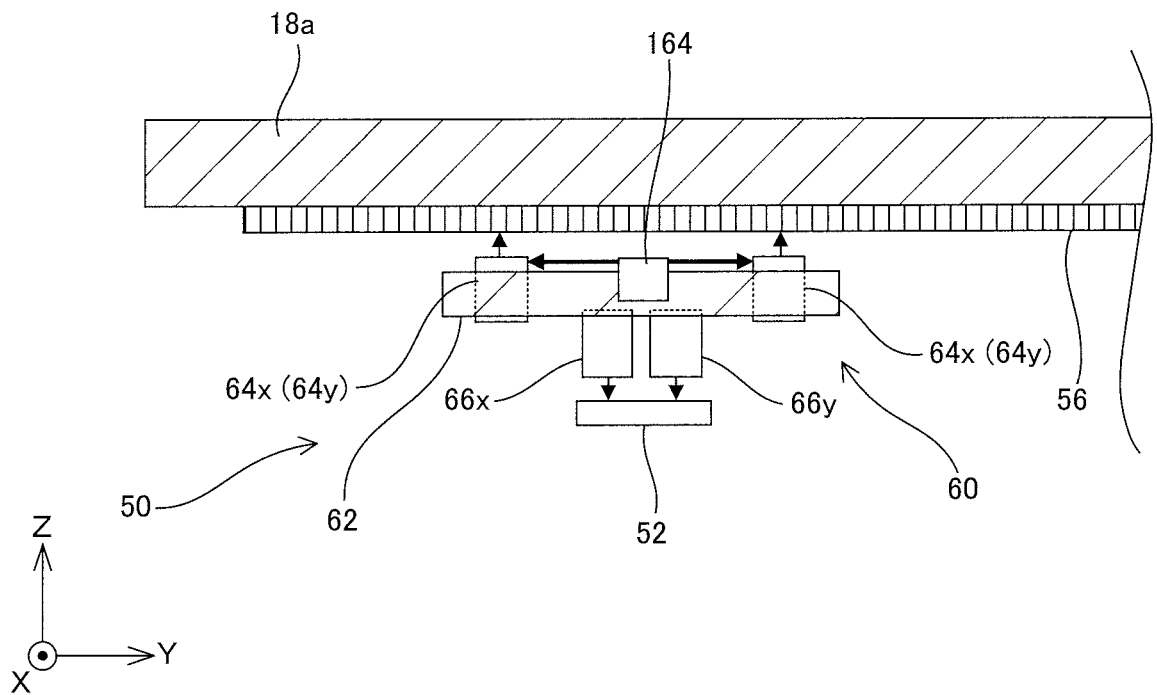
FIGS. 14A and 14B are views (No. 1 and No. 2) used to explain a configuration of a measurement system for obtaining a distance between a pair of heads.
Figure 14B:
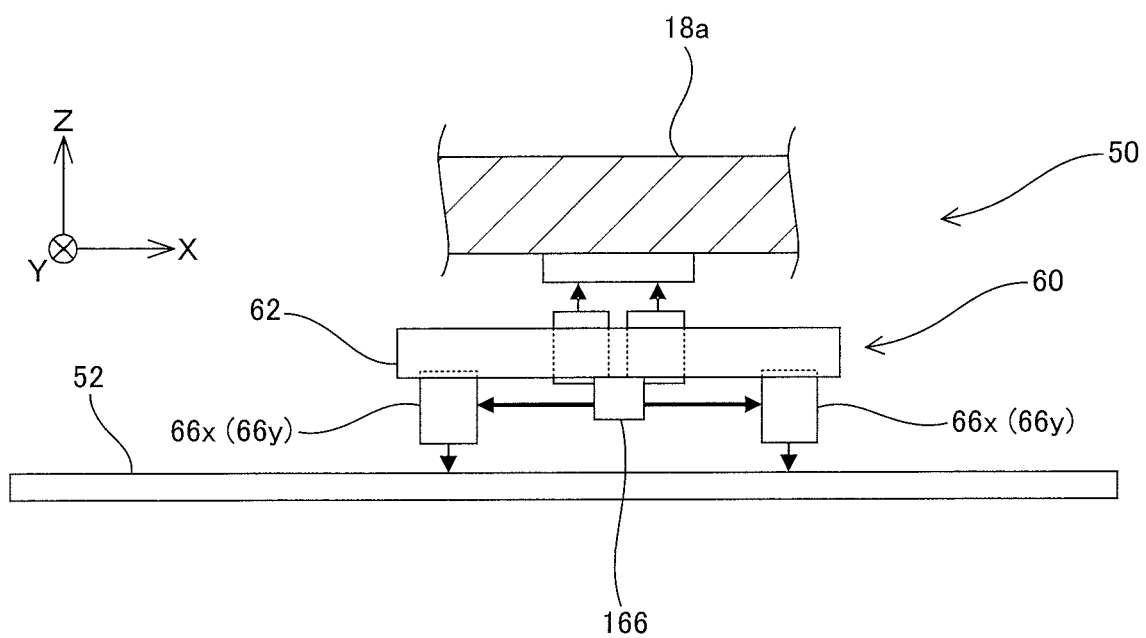

Further, as illustrated in FIGS. 14A and 14B, the distances between the respective pairs of encoder heads that head unit 60 has (i.e., the respective distances between a pair of X heads 64x, between a pair of X heads 66x, between a pair of Y heads 64y and between a pair of Y heads 66y) may be measured by sensors 164 and 166, and the output of substrate encoder system 50 may be corrected using the measurement values. The type of sensors 164 and 166 is not particularly limited, and for example, a laser interferometer or the like can be used. As is described above, the linkage processing of the outputs of a pair of encoder heads is performed in substrate encoder system 50, and it is the precondition that the distance between the pair of encoder heads is known and invariable. Therefore, Y slide table 62 to which the heads are attached is made of, for example, a material less affected by thermal expansion or the like. However, the position information of substrate P can be obtained with high accuracy by measuring the distances between the encoder heads as in the present modified example, even if Y slide table 62 is deformed (the distance between a pair of encoder heads is changed). Similarly, also in mask encoder system 48, the distances between the respective pairs of encoder heads (i.e., the respective distances between a pair of X heads 49$x$ and between a pair of Y heads 49$y$) may be measured, and the output of mask encoder system 48 may be corrected using the measurement values. Further, the relative positional relationships between all (e.g. a total of eight in the present embodiment) of the heads (the pairs of downward heads 66$x$ and 66$y$, and the pairs of upward heads 64$x$ and 64$y$) may be each measured, and the measurement values may be corrected.

Further, as is described above, a calibration operation may be performed in which the distances between the respective pairs of encoder heads that head unit 60 has (i.e., the respective distances between a pair of X heads 64$x$, between a pair of X heads 66$x$, between a pair of Y heads 64$y$ and between a pair of Y heads 66Y) are measured as needed (e.g., at every substrate exchange). Further, separately from a calibration point for performing the foregoing measurement of the distances between the heads, another calibration point for performing the positioning of the origins of the respective outputs of mask encoder system 48 and substrate encoder system 50 may be provided. For example, positioning marks for performing the positioning of the origins may be disposed on the extended lines of (on the outer side of) the plurality of scales 46 and 52, or may be disposed between a pair of scales 46 adjacent to each other and a pair of scales 52 adjacent to each other, or may be formed in scales 46 and 52.

Figure 15A:
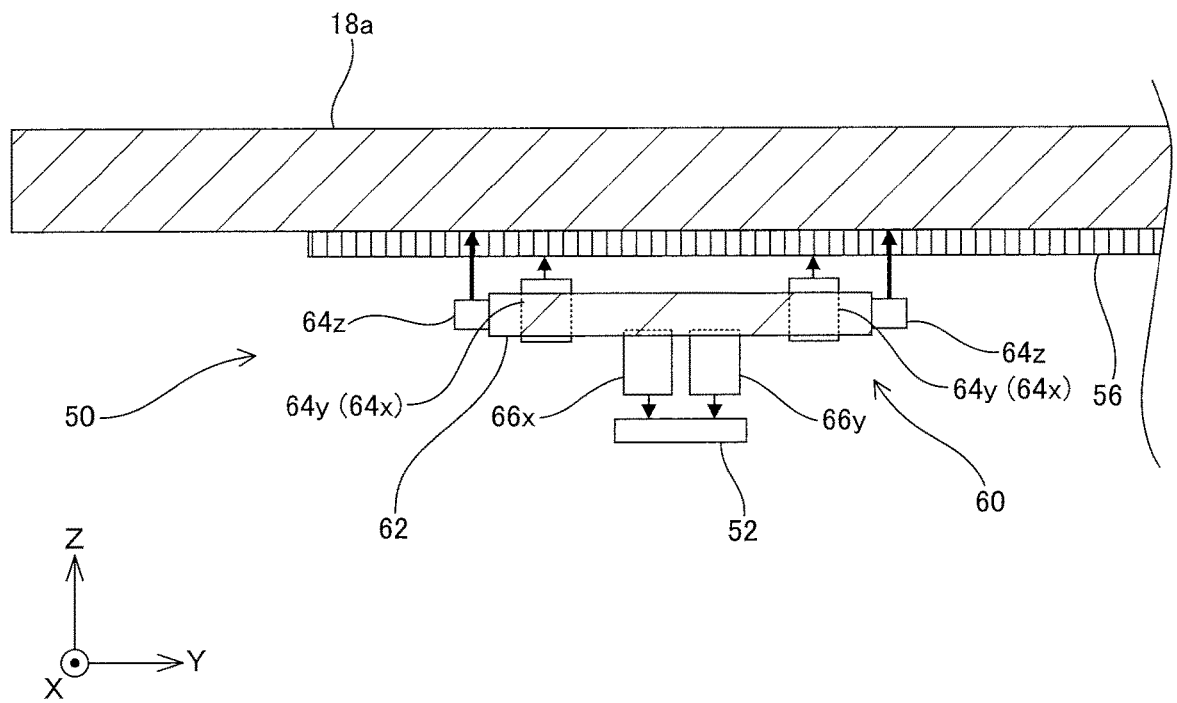
FIGS. 15A and 15B are views (No. 1 and No. 2) used to explain a configuration of a measurement system for obtaining a tilt amount of a Y slide table.
Figure 15B:
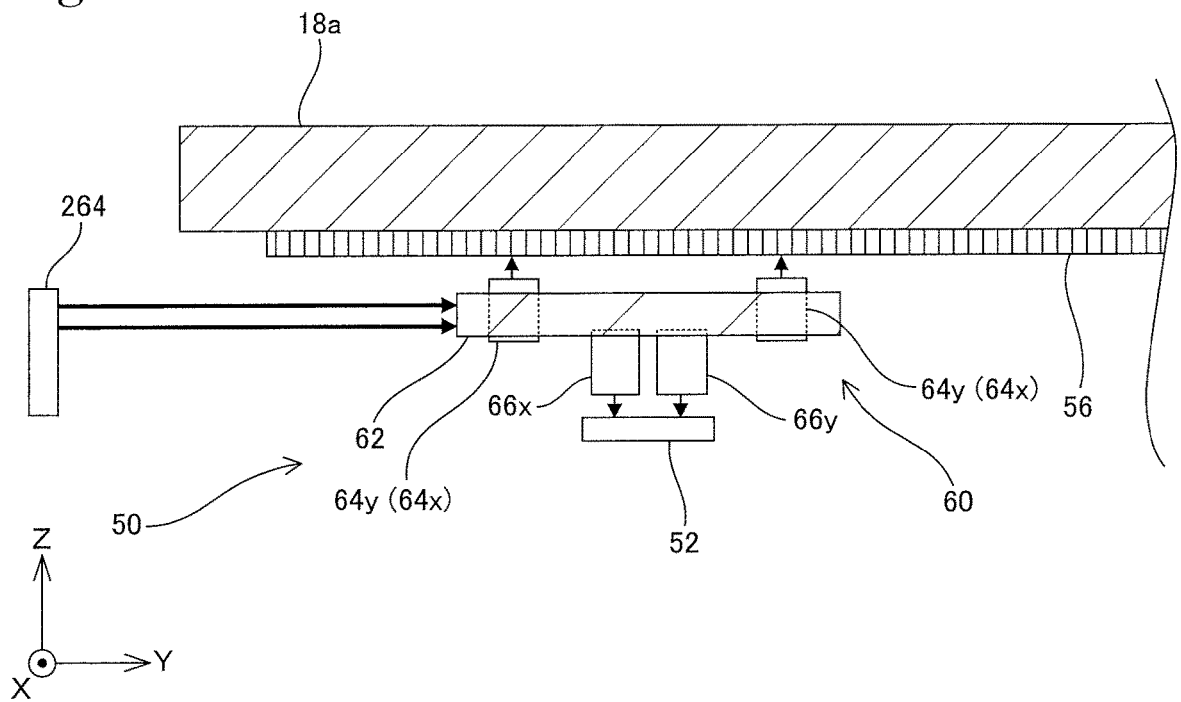

Further, the amount of tilt (inclination in the Ox direction and the Oy direction) of Y slide table 62, to which each of encoder heads 64$x$, 64$y$, 66$x$ and 66$y$ is attached, with respect to the horizontal plane may be obtained, and the output of substrate encoder system 50 may be corrected in accordance with the tilt amount (the inclined amount of the optical axis of each of heads 64$x$, 64$y$, 66$x$ and 66$y$). As a measurement system, as illustrated in FIG. 15A, a measurement system in which a plurality of Z sensors 64$z$ are attached to Y slide table 62 and the tilt amount of Y slide table 62 is obtained with upper mount section 18$a$ serving as a reference can be used. Alternatively, as illustrated in FIG. 15B, a biaxial laser interferometer 264 may be provided at substrate holder 34 (see FIG. 1), and the tilt amount (the inclination amount in the θx direction and the θy direction) and the rotation amount (the rotation amount in the θz direction) of Y slide table 62 may be obtained. Further, the tilt amount of each of encoder heads 64$x$, 64$y$, 66$x$ and 66$y$ may be individually measured.

Further, for example, the disposition of the encoder heads and the scales may be reversed in mask encoder system 48 and substrate encoder system 50 of the first embodiment described above. That is, for example, X linear encoders 92$x$ and Y linear encoders 92$y$ for obtaining the position information of mask holder 40 may have a configuration in which the encoder heads are attached to mask holder 40 and the scales are attached to encoder base 43. Further, in X linear encoders 96$x$ and Y linear encoders 96$y$ for obtaining the position information of substrate holder 34, the scales may be attached to Y slide table 62 and the encoder heads may be attached to substrate holder 34. In this case, the encoder heads attached to substrate holder 34 should be disposed at a plurality of positions along the Y-axis direction (in the case of the first embodiment) or the X-axis direction (in the case of the second embodiment), and should be configured capable of performing the switching operation mutually. Similarly, in X linear encoders 94$x$ and Y linear encoders 94$y$ for obtaining the position information of Y slide table 62, the scales may be attached to Y slide table 62 and the encoder heads may be attached to apparatus main body 18. In this case, the encoder heads attached to encoder base 43 should be disposed at a plurality of positions along the X-axis direction (in the case of the first embodiment) or the Y-axis direction (in the case of the second embodiment), and should be configured capable of performing the switching operation mutually. In this case, the scales fixed to Y slide table 62 may be shared.

Further, the case has been described where, for example, the three scales 46 are disposed spaced apart in the X-axis direction in mask encoder system 48, and for example, the four scales 52 are disposed spaced apart in the Y-axis direction and, for example, the four scales 56 are disposed spaced apart in the X-axis direction in substrate encoder system 50 of the first embodiment. However, the number of the scales is not limited thereto, and can be changed as needed, depending on, for example, the size of mask M, the size of substrate P or the movement strokes. Further, the plurality of scales need not necessarily be disposed spaced apart, and for example, one longer scale (in the embodiments described above, for example, a scale about three times longer than scale 46, a scale about four times longer than scale 52, and a sale about four times longer than scale 56) may be used.

Further, in the case of providing a plurality of scales, the respective lengths of the scales may be different from one another. For example, the length of the scales extending in the X-axis direction is set longer than the length of a shot area in the X-axis direction, and thereby the linkage processing at the time of the scanning exposure operation can be avoided. The same applies to the scales extending in the Y-axis direction. Furthermore, in order to cope with the change in the number of the shot areas (for example, in the case of preparing four areas and the case of preparing six areas), a scale disposed on one side of projection optical system 16 and a scale disposed on the other side may have the respective lengths different from each other. And, both the scales may be disposed relatively shifted in the X-axis direction.

Further, in the embodiments described above, a configuration is employed in which the X scales (the grating patterns for X-axis direction measurement illustrated in the drawings) and the Y scales (the grating patterns for Y-axis direction measurement illustrated in the drawings) are provided at members for scales that are independent from each other (e.g., a plurality of scale members disposed on the encoder base). However, the plurality of grating patterns may be divided into groups of grating patterns and the groups of grating patterns may be separately formed on the same long member for scales. Further, the grating patterns may be successively formed on the same long member for scales.

Further, in the case where a plurality of scale groups (scale rows) on substrate holder 34, in each of which a plurality of scales are arranged in line via a gap of a predetermined spacing in the X-axis direction, are disposed at different positions spaced from each other in the Y-axis direction (e.g., the position on one side (the +Y side) and the position on the other side (the −Y side) with respect to projection optical system 16), the positions of the gaps of the predetermined spacing described above may be disposed not to overlap in the X-axis direction among the plurality of scale rows. By disposing the plurality of scale rows in this manner, the heads placed corresponding to the respective scale rows can be prevented from being simultaneously located outside the measurement range (in other words, both the heads can be prevented from simultaneously facing the gaps).

Further, in the scale groups (the scale rows) on substrate holder 34, in each of which a plurality of scales are arranged in line via a gap of a predetermined spacing in the X-axis direction, the length of one scale (a pattern for X-axis measurement) in the X-axis direction may be set to a length with which the measurement of only the length of one shot area can be continuously performed (a length along which a device pattern is formed on a substrate by being irradiated when scan exposure is performed while moving the substrate on a substrate holder in the X-axis direction). By setting the length of one scale in the X-axis direction in this manner, the transfer control of heads with respect to a plurality of scales does not have to be performed during the scan exposure of one shot area, and therefore the position measurement (the position control) of substrate P (the substrate holder) during the scan exposure can be performed easily.

Further, in the scale groups (the scale rows) on substrate holder 34, in each of which a plurality of scales are arranged in line via a gap of a predetermined spacing in the X-axis direction, the scales with the same length are arranged in line in the embodiments described above, but the scales with lengths different from each other may be arranged in line. For example, in a scale row on substrate holder 34, the length in the X-axis direction of scales disposed in the central part may be set physically longer than the length in the X-axis direction of scales disposed near both ends in the X-axis direction (scales disposed at the respective ends in a scale row).

Note that, in a scale group (a scale row) on substrate holder 34, in which a plurality of scales are arranged in line via a gap of a predetermined spacing in the X-axis direction, the distance between the plurality of scales (in other words, the length of the gap), the length of one scale and two heads that are relatively moved with respect to that scale row (the heads disposed facing each other inside one head unit 60, e.g., the two heads 66x as illustrated in FIG. 6) are disposed so that the relationship of "the length of one scale>the distance between the heads disposed facing each other>the distance between the scales" is satisfied. This relationship is satisfied not only between the scales provided on substrate holder 34 and the corresponding head units 60 but also between scales 56 and the corresponding head units 60.

Note that in the case where, while a given head unit 60 and a scale row corresponding thereto (a scale row in which a plurality of scales are arranged in line via a predetermined gap in a predetermined direction) are being relatively moved in the X-axis direction, a given set of heads in head unit 60 (e.g. X head 66x and Y head 66y in FIG. 6) simultaneously face the gap between the foregoing scales, and then simultaneously face another scale (i.e., in the case where heads 66x and 66y transfer to another scale), the initial measurement values of the heads that have transferred need to be computed. On this computation, by using the outputs of a remaining set of heads (66x and 66y) in head unit 60 that are different from the heads that have transferred and the output of yet-another head that is different from these heads (a head spaced apart in the X-axis direction and disposed at a position whose distance from the heads having moved off from the scale is shorter than the scale length), the initial values on the transfer of the heads that have transferred may be computed. The foregoing yet-another head may be either of a head for position measurement in the X-axis direction or a head for position measurement in the Y-axis direction.

Further, in each of the embodiments described above, although there is the description that head units 60 are moved synchronously with substrate holder 34, this means that head units 60 are moved in a state of roughly maintaining the relative positional relationship with substrate holder 34, and is not limited to the case where head units 60 and substrate holder 34 are moved in a state where the positional relationship between head units 60 and substrate holder 34, their movement directions, and their movement velocities strictly coincide with each other.

Although the case has been described where the X scale and the Y scale are independently formed on the surface of each of scales 46, 52 and 56, this is not intended to be limiting, and for example, an XY two-dimensional scale may be used. In this case, as the encoder head, an XY two-dimensional head can be used. Further, although the case of using the encoder system of a diffraction interference method has been described, this is not intended to be limiting, and the other encoder such as an encoder of a so-called pick-up method and an encoder of a magnetic method can be used, and a so-called scan encoder that is disclosed in, for example, U.S. Pat. No. 6,639,686 and the like can also be used. Further, the position information of Y slide table 62 may be obtained by a measurement system (e.g. an optical interferometer system) other than the encoder system.

Further, although a plurality of scales 56 are configured to be pasted directly on the lower surface of upper mount section 18a (the optical surface plate), this is not intended to be limiting, and a predetermined base member may be disposed in a suspended manner in a state spaced apart from the lower surface of upper mount section 18a, and the plurality of scales 56 may be pasted to the base member.

Further, substrate stage device 20 only has to drive substrate P with a long stroke at least along the horizontal plane, and the fine positioning in the directions of six degrees of freedom needs not be performed according to the circumstances. The substrate encoder system related to each of the embodiments described above can be suitably applied to such a two-dimensional stage device.

Further, the illumination light may be ultraviolet light such as an ArF excimer laser beam (with a wavelength of 193 nm) or a KrF excimer laser beam (with a wavelength of 248 nm), or vacuum ultraviolet light such as an $F_2$ laser beam (with a wavelength of 157 nm). Further, as the illumination light, a harmonic wave, which is obtained by amplifying a single-wavelength laser beam in the infrared or visible range emitted by, for example, a DFB semiconductor laser or a fiber laser, with a fiber amplifier doped with, for example, erbium (or both erbium and ytterbium), and by converting the wavelength into ultraviolet light using a nonlinear optical crystal, may also be used. Further, a solid laser (with a wavelength: 355 nm and 266 nm) or the like may be used.

Further, although the case has been described where projection optical system 16 is a projection optical system of a multi-lens method equipped with a plurality of optical systems, the number of the projection optical systems is not limited thereto, and one or more of the projection optical systems have only to be provided. Further, the projection optical system is not limited to the projection optical system of a multi-lens method, but may be a projection optical system using an Offner-type large mirror or the like. Further, projection optical system 16 may be a magnifying system or a reduction system.

Further, the use of the exposure apparatus is not limited to the exposure apparatus for liquid crystal display devices that transfers a liquid crystal display device pattern onto a square-shaped glass plate, but can be widely applied also to, for example, an exposure apparatus for manufacturing organic EL (Electro-Luminescence) panels, an exposure apparatus for manufacturing semiconductor devices, and an exposure apparatus for manufacturing thin-film magnetic heads, micromachines, DNA chips or the like. Further, each of the embodiments described above can also be applied to an exposure apparatus that transfers a circuit pattern onto a glass substrate or a silicon wafer or the like, not only when producing microdevices such as semiconductor devices, but also when producing a mask or a reticle used in an exposure apparatus such as an optical exposure apparatus, an EUV exposure apparatus, an X-ray exposure apparatus, or an electron beam exposure apparatus.

Further, an object serving as an exposure target is not limited to a glass plate, but may be other objects such as, for example, a wafer, a ceramic substrate, a film member, or a mask blank. Further, in the case where an object to be exposed is a substrate for flat-panel display, the thickness of the substrate is not particularly limited, and for example, a film-like member (a sheet-like member with flexibility) is also included. Note that the exposure apparatus of the present embodiments is especially effective in the case where a substrate having a side or a diagonal line with a length of 500 mm or greater is an object to be exposed.

Electronic devices such as liquid crystal display devices (or semiconductor devices) are manufactured through the steps such as: a step in which the function/performance design of a device is performed; a step in which a mask (or a reticle) based on the design step is manufactured; a step in which a glass substrate (or a wafer) is manufactured; a lithography step in which a pattern of the mask (the reticle) is transferred onto the glass substrate with the exposure apparatus in each of the embodiments described above and the exposure method thereof; a development step in which the glass substrate that has been exposed is developed; an etching step in which an exposed member of the other section than a section where resist remains is removed by etching; a resist removal step in which the resist that is no longer necessary when etching is completed is removed; a device assembly step; and an inspection step. In this case, in the lithography step, the exposure method described previously is implemented using the exposure apparatus in the embodiments described above and a device pattern is formed on the glass substrate, and therefore, the devices with a high integration degree can be manufactured with high productivity.

Incidentally, the disclosures of all the U.S. Patent Application Publications and the U.S. Patents related to exposure apparatuses and the like that are cited in the embodiments described above are each incorporated herein by reference.

INDUSTRIAL APPLICABILITY

As is described so far, the exposure apparatus and the exposure method of the present invention are suitable for exposing objects with illumination light. Further, the manufacturing method of flat-panel displays of the present invention is suitable for production of flat-panel displays. Further, the device manufacturing method of the present invention is suitable for production of microdevices.

REFERENCE SIGNS LIST

10 . . . liquid crystal exposure apparatus,
14 . . . mask stage device,
20 . . . substrate stage device,
34 . . . substrate holder,
40 . . . mask holder,
44 . . . head unit,
46 . . . scale,
48 . . . mask encoder system,
50 . . . substrate encoder system,
52 . . . scale,
56 . . . scale,
60 . . . head unit,
90 . . . main controller,
M . . . mask,
P . . . substrate.

The invention claimed is:
1. An exposure apparatus that exposes an object with an illumination light via a projection optical system, the apparatus comprising:
  a holding section that holds the object and is movable in a first direction and a second direction intersecting each other;
  a first position measurement section that has a first grating member provided with a plurality of grating areas and a first head to irradiate the first grating member facing the first head with a measurement beam, and acquires first position information of the holding section in the first direction based on an output of the first head, one of the first grating member and the first head being provided at the holding section;
  a frame member that supports the projection optical system;
  a second position measurement section that has a second grating member provided with a plurality of grating areas and a second head to irradiate the second grating member facing the second head with a measurement beam, one of the second grating member and the second head being provided at the frame member;
  a movable body provided with the other of the first grating member and the first head and the other of the second grating member and the second head, and is movable in the second direction between the holding section and the frame member;
  a drive section that moves the holding section in the first direction and the second direction; and
  a connecting member that connects the drive section and the movable body, wherein
  the second position measurement section acquires second position information of the movable body with respect to the frame member in the second direction based on an output of the second head,
  the drive section controls a position of the holding section with respect to the frame member based on the first position information and the second position information,
  in movement of the holding section in the first direction by the drive section, the one of the first grating member and the first head provided at the holding section is relatively moved with respect to the other of the first grating member and the first head in the first direction while maintaining a facing state between the second head and the second grating member,
  the drive section moves the holding section and the movable body in the second direction so that one of the second grating member and the second head is relatively moved with respect to the other of the second grating member and the second head in the second direction while maintaining a facing state between the first head and the first grating member, in movement of the holding section in the second direction, and the drive section causes the movable body to move in the second direction via the connecting member in a position between the holding section and the frame member.

2. The exposure apparatus according to claim 1, further comprising:

a forming device having another drive section that moves a pattern holding body holding a predetermined pattern in the first direction, the forming device forming the predetermined pattern on the object that is moved in the first direction, via the pattern holding body using an energy beam.

3. The exposure apparatus according to claim 2, wherein the object is a substrate used in a flat-panel display.

4. The exposure apparatus according to claim 3, wherein the substrate has at least a side or a diagonal line with a length of 500 mm or greater.

5. A manufacturing method of a flat-panel display, comprising:

exposing the object using the exposure apparatus according to claim 3; and developing the object that has been exposed.

6. A device manufacturing method, comprising:

exposing the object using the exposure apparatus according to claim 2; and developing the object that has been exposed.

7. The exposure apparatus according to claim 1, wherein in the first head and the second head, the measurement beam moves off from one grating area of the plurality of grating areas to which the head faces and the measurement beam transfers from the one grating area to another grating area adjacent to the one grating area, during movement of the holding section in the first direction and the second direction.

8. The exposure apparatus according to claim 1, further comprising:

a forming device having another drive section that moves a pattern holding body holding a predetermined pattern in the second direction, the forming device forming the predetermined pattern on the object that is moved in the second direction, via the pattern holding body using an energy beam.

9. The exposure apparatus according to claim 8, wherein the object is a substrate used in a flat-panel display.

10. The exposure apparatus according to claim 9, wherein the substrate has at least a side or a diagonal line with a length of 500 mm or greater.

11. A manufacturing method of a flat-panel display, comprising:

exposing the object using the exposure apparatus according to claim 9; and developing the object that has been exposed.

12. A device manufacturing method, comprising:

exposing the object using the exposure apparatus according to claim 8; and developing the object that has been exposed.

* * * * *